US011606523B2

(12) United States Patent
Kang et al.

(10) Patent No.: US 11,606,523 B2
(45) Date of Patent: Mar. 14, 2023

(54) IMAGE SENSOR HAVING REDUCED PARASITIC CAPACITANCE

(71) Applicant: SAMSUNG ELECTRONICS CO., LTD., Suwon-si (KR)

(72) Inventors: Sunyool Kang, Suwon-si (KR); Yongjun Cho, Hwaseong-si (KR); Yunhwan Jung, Hwaseong-si (KR); Heesung Chae, Seoul (KR); Kyungmin Kim, Seoul (KR); Haesick Sul, Hwaseong-si (KR); Sukki Yoon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 153 days.

(21) Appl. No.: 16/890,422

(22) Filed: Jun. 2, 2020

(65) Prior Publication Data

US 2021/0120200 A1 Apr. 22, 2021

(30) Foreign Application Priority Data

Oct. 17, 2019 (KR) .................. 10-2019-0128980

(51) Int. Cl.
*H04N 5/3745* (2011.01)
*H01L 27/146* (2006.01)

(52) U.S. Cl.
CPC ... *H04N 5/37455* (2013.01); *H01L 27/14623* (2013.01); *H01L 27/14636* (2013.01)

(58) Field of Classification Search
CPC .. H04N 5/37455; H04N 5/3577; H04N 5/378; H04N 5/357; H01L 27/14623; H01L 27/14636; H01L 27/14603
See application file for complete search history.

(56) References Cited

U.S. PATENT DOCUMENTS 7,995,022 B2 8/2011 Yoshioka et al.
8,259,206 B1 9/2012 Shibata et al.
(Continued)

FOREIGN PATENT DOCUMENTS

EP        3282688 A1   2/2018
KR  10-2019-0038799 A  4/2019

OTHER PUBLICATIONS

Communication dated Feb. 9, 2021 issued by the European Patent Office in application No. 20196067.1.

*Primary Examiner* — Gevell V Selby
(74) *Attorney, Agent, or Firm* — Sughrue Mion, PLLC

(57) ABSTRACT

An image sensor, including a pixel array including a plurality of pixels connected to row lines extending in a first direction and column lines extending in a second direction intersecting the first direction; a ramp voltage generator configured to output a ramp voltage; a sampling circuit including a plurality of comparators, each comparator of the plurality of comparators having a first input terminal connected to a column of the column lines and a second input terminal configured to receive the ramp voltage; and an analog-to-digital converter configured to convert an output of the plurality of comparators to a digital signal, wherein the plurality of comparators include a first comparator connected to a first column line, and a second comparator connected to a second column line adjacent to the first column line in the first direction, wherein each of the first comparator and the second comparator includes a first transistor and a second transistor disposed sequentially in the second direction, and wherein a gap between the first transistor of the first comparator and the second transistor of the first comparator is different from a gap between the first transistor of the second comparator and the second transistor of the second comparator.

26 Claims, 21 Drawing Sheets

(56) References Cited

U.S. PATENT DOCUMENTS

| | | |
|---|---|---|
| 8,362,934 B2 | 1/2013 | Matsuzawa et al. |
| 8,520,107 B2 | 8/2013 | Nishimura et al. |
| 10,237,507 B2 | 3/2019 | Bairo |
| 2009/0128653 A1* | 5/2009 | Tanaka ............... H04N 5/374 348/222.1 |
| 2014/0022430 A1* | 1/2014 | Ueno ............... H04N 5/37455 348/308 |
| 2017/0201702 A1* | 7/2017 | Niwa ............... H04N 5/378 |
| 2017/0257582 A1 | 9/2017 | Jung et al. |
| 2018/0109750 A1* | 4/2018 | Sukegawa ............ H04N 5/369 |
| 2019/0208151 A1 | 7/2019 | Taura |

* cited by examiner

IMAGE SENSOR HAVING REDUCED PARASITIC CAPACITANCE

CROSS-REFERENCE TO THE RELATED APPLICATION

This application is based on and claims priority under 35 U.S.C. § 119 to Korean Patent Application No. 10-2019-0128980 filed on Oct. 17, 2019 in the Korean Intellectual Property Office, the disclosure of which is incorporated by reference herein in its entirety.

BACKGROUND

1. Field

The present disclosure relates to an image sensor.

2. Description of Related Art

An image sensor may be a semiconductor-based sensor which may generate an electrical signal in response to light. An image sensor may include a pixel array having a plurality of pixels, a logic circuit for driving a pixel array and generating an image, and may further include a photodiode for generating an electric charge in response to light, and a pixel circuit for outputting a pixel signal using an electric charge generated by a photodiode. A size each pixel included in an image sensor may be determined in accordance with a plate shape and resolution of an image sensor. By reducing sizes of pixels, resolution of an image sensor may improve, but operation properties may deteriorate due to an increase of a coupling element.

SUMMARY

Provided is an image sensor which may have improved operational performance including noise properties by reducing an effect of a capacitance element caused by a coupling effect between devices that provide circuits connected to pixels.

According to an embodiment, an image sensor includes a pixel array including a plurality of pixels connected to row lines extending in a first direction and column lines extending in a second direction intersecting the first direction; a ramp voltage generator configured to output a ramp voltage; a sampling circuit including a plurality of comparators, each comparator of the plurality of comparators having a first input terminal connected to a column of the column lines and a second input terminal configured to receive the ramp voltage; and an analog-to-digital converter configured to convert an output of the plurality of comparators to a digital signal, wherein the plurality of comparators include a first comparator connected to a first column line, and a second comparator connected to a second column line adjacent to the first column line in the first direction, wherein each of the first comparator and the second comparator includes a first transistor and a second transistor disposed sequentially in the second direction, and wherein a gap between the first transistor of the first comparator and the second transistor of the first comparator is different from a gap between the first transistor of the second comparator and the second transistor of the second comparator.

According to an embodiment, an image sensor includes a pixel array including a plurality of pixels connected to row lines extending in a first direction and column lines extending in a second direction intersecting the first direction; and a sampling circuit including a plurality of comparators and connected to the column lines, wherein the plurality of comparators include circuit elements disposed on a substrate and a plurality of metal oxide semiconductor (MOS) capacitors configured to determine a bandwidth of an output signal, wherein the plurality of comparators includes odd comparators connected to odd-numbered column lines and even comparators connected to even-numbered column lines, wherein the plurality of MOS capacitors includes odd MOS capacitors corresponding to the odd comparators and even MOS capacitors corresponding to the even comparators, wherein the odd MOS capacitors are disposed in a first position in the second direction, and the even MOS capacitors are disposed in a second position in the second direction, and wherein the second position is different from the first position.

According to an embodiment, an image sensor includes a pixel array including a plurality of pixels connected to a plurality of row lines extending in a first direction and a plurality of column lines; and a plurality of comparators connected to the column lines, and disposed in a plurality of unit regions arranged in the first direction, wherein each of the plurality of comparators includes a first transistor and a second transistor, wherein the plurality of comparators includes a pair of adjacent comparators, and wherein a gap between first transistors included in the pair of adjacent comparators is smaller than a gap between second transistors included in the pair of adjacent comparators.

BRIEF DESCRIPTION OF DRAWINGS

The above and other aspects, features, and advantages will be more clearly understood from the following detailed description, taken in conjunction with the accompanying drawings, in which.

DETAILED DESCRIPTION

Hereinafter, example embodiments of the inventive concept will be described as follows with reference to the accompanying drawings. The inventive concept is not limited to these embodiments disclosed below and may be realized in various other forms.

Figure 1:
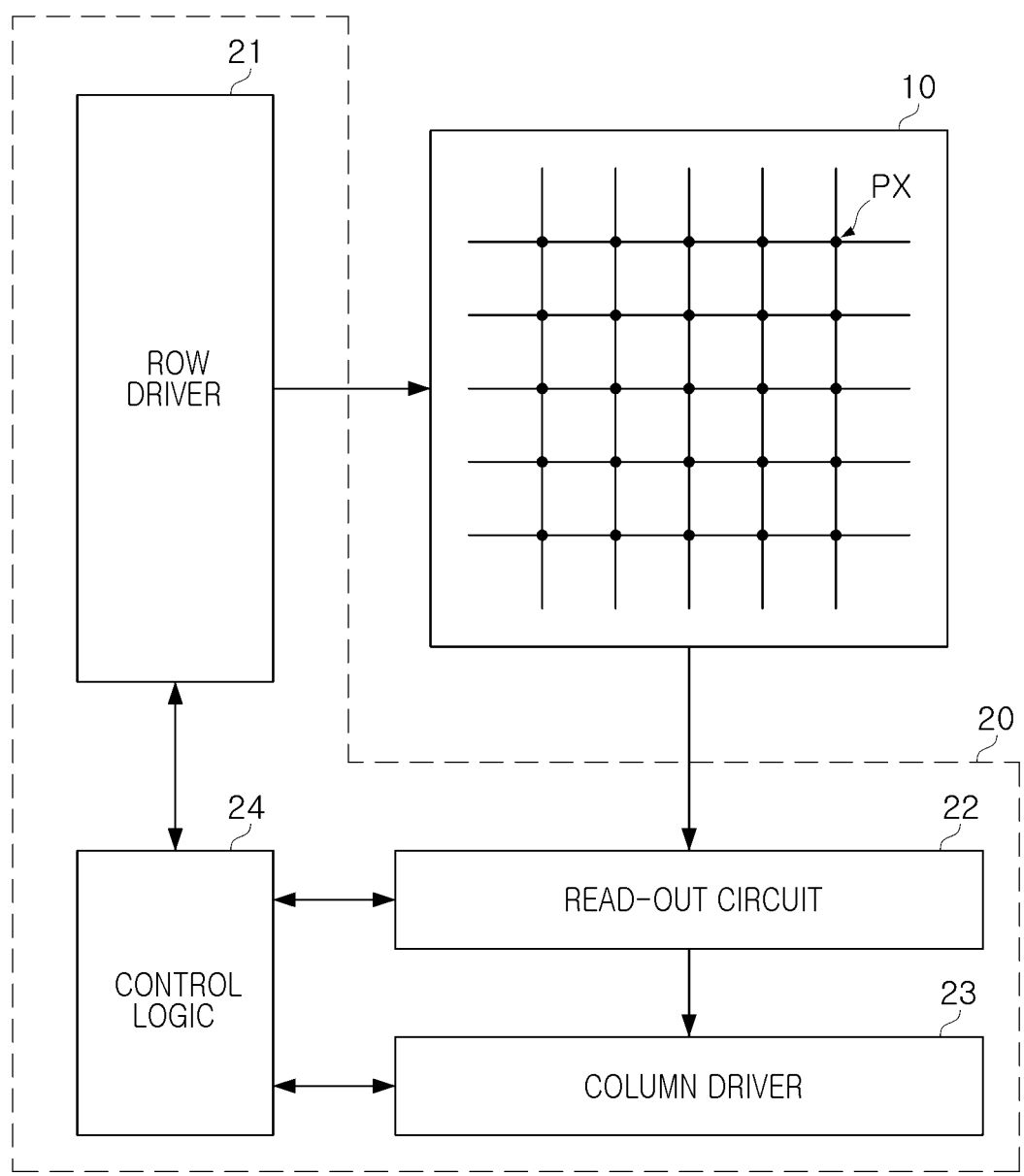
FIG. 1 is a block diagram illustrating an image sensor according to an example embodiment.

FIG. 1 is a block diagram illustrating an image sensor according to an example embodiment.

Referring to FIG. 1, an image sensor 1 may include a pixel array 10 and a controller 20, among other elements.

The pixel array 10 may include a plurality of pixels PX disposed in array form along a plurality of rows and a plurality of columns. Each of the plurality of pixels PX may include a photodiode which may generate an electric charge in response to an optical signal incident from the outside, a pixel circuit which may generate an electric signal corresponding to an electric charge generated by a photodiode, and other components. As an example, the pixel circuit may include a floating diffusion, a storage transistor, a transfer transistor, a reset transistor, a drive transistor, a select transistor, and the like. In example embodiments, the configuration of the pixels PX may be varied. As an example, each of the pixels PX may include an organic photodiode including an organic material, as opposed to a silicon photodiode, or may be implemented as a digital pixel. When the pixels PX are implemented as digital pixels, each of the pixels PX may include a comparator, a counter which may convert an output of the comparator to a digital signal and output the digital signal, and other components.

The controller 20 may include circuits for controlling the pixel array 10. As an example, the controller 20 may include a row driver 21, a read-out circuit 22, a column driver 23, a control logic 24, and the like. The row driver 21 may drive the pixel array 10 by row unit. For example, the row driver 21 may generate a transfer control signal for controlling a transfer transistor of a pixel circuit, a reset control signal for controlling a reset transistor, a select control signal for controlling a select transistor, and the like, and may input the signals to the pixel array 10.

The read-out circuit 22 may include a comparator, a DBS circuit which may convert an output of the comparator to a digital signal, and others. The comparator may be connected to the pixels PX included in a row selected by a row selecting signal supplied by the row driver 21 through column lines, may compare a reset voltage and a pixel voltage with a ramp voltage by performing the correlated double sampling, and may output an analog timing signal. The DBS circuit may convert the analog timing signal output by the comparator to a digital signal and may transfer the digital signal to the column driver 23. The DBS circuit may include a counter circuit, and others.

The column driver 23 may include a latch for temporarily storing a digital signal, or a buffer circuit, an amplifier circuit, and others, and may process a digital signal received from the read-out circuit 22. The row driver 21, the read-out circuit 22, and the column driver 23 may be controlled by the control logic 24. The control logic 24 may include a timing controller for controlling operation timings of the row driver 21, the read-out circuit 22, and the column driver 23, an image signal processor for processing image data, and others.

The control logic 24 may generate image data by signal-processing the data output by the read-out circuit 22 and the column driver 23. The control logic 24 may also control operation timings, and the like, of the row driver 21, the read-out circuit 22, and the column driver 23.

Figure 2:
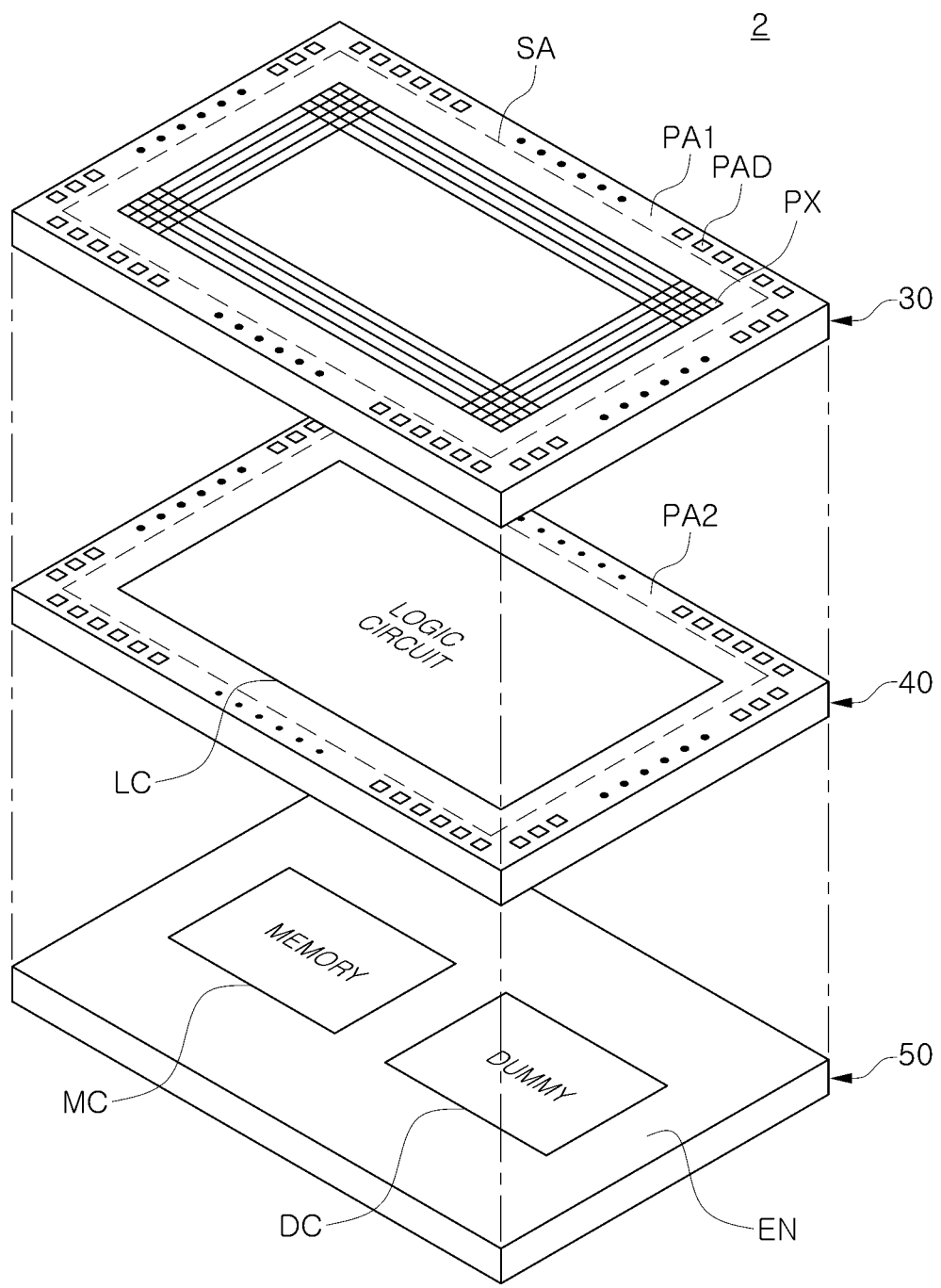
FIGS. 2 and 3 are diagrams illustrating an image sensor according to an example embodiment.
Figure 3:
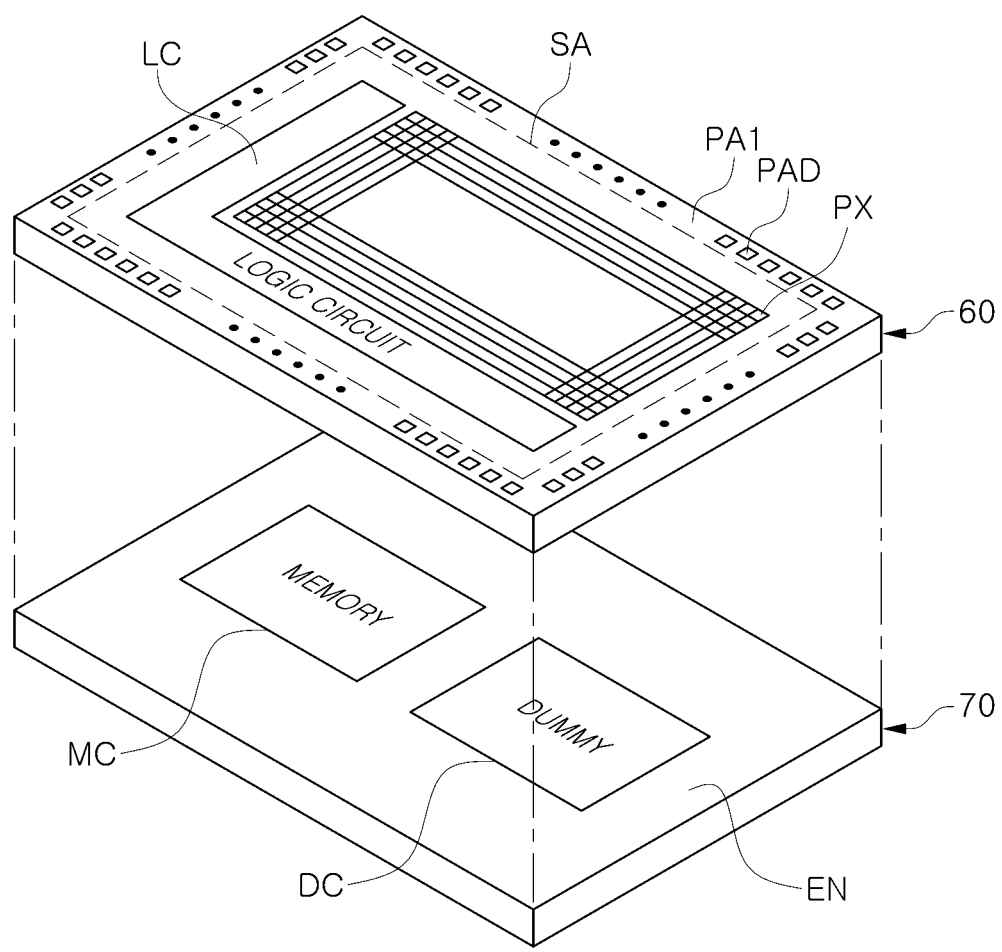

FIGS. 2 and 3 are diagrams illustrating an image sensor according to an example embodiment.

Referring to FIG. 2, an image sensor 2 in the example embodiment may include a first layer 30, a second layer 40 arranged below the first layer 30, a third layer 50 arranged below the image sensor 2, and the like. The first layer 30, the second layer 40, and the third layer 50 may be alternately stacked in a vertical direction. In an example embodiment, the first layer 30 and the second layer 40 may be stacked on a wafer level, and the third layer 50 may be attached below the second layer 40 on a chip level. The first to third layers 30 to 50 may be provided as a single semiconductor package.

The first layer 30 may include a sensing region SA in which the plurality of pixels PX are arranged, and a first pad region PA1 arranged in a periphery of the sensing region SA. A plurality of upper pads PAD may be included in the first pad region PA1, and the plurality of upper pads PAD may be connected to pads and a logic circuit LC arranged in a second pad region PA2 of the second layer 40 through a via, and the like.

Each of the plurality of pixels PX may include a photodiode generating an electric charge in response to light, a pixel circuit processing an electric charge generated by the photodiode, and others. The pixel circuit may include a plurality of transistors for outputting a voltage corresponding to an electric charge generated by the photodiode.

The second layer 40 may include a plurality of circuit elements providing a logic circuit LC. The plurality of circuit elements included in the logic circuit LC may provide circuits for driving a pixel circuit arranged on the first layer 30, for example a row driver, a column driver, a timing controller, and the like. A plurality of circuit elements included in the logic circuit LC may be connected to a pixel circuit through the first and second pad regions PA1 and PA2. The logic circuit LC may obtain a reset voltage and a pixel voltage from the plurality of pixels PX, and may generate a pixel signal.

In an example embodiment, at least one of the plurality of pixels PX may include a plurality of photodiodes arranged on the same level. Pixel signals generated from electric charges of the plurality of photodiodes, respectively, may have a phase difference therebetween, and the logic circuit LC may provide an autofocusing function on the basis of phase differences of the pixel signals generated by the plurality of photodiodes included in a single pixel PX.

The third layer 50 disposed below the second layer 40 may include a memory chip MC, a dummy chip DC, a protective layer EN sealing the memory chip MC and the dummy chip DC. The memory chip MC may be configured as a dynamic random access memory (DRAM) or a static random access memory (SRAM), and the dummy chip DC may not substantially function to store data. The memory chip MC may be electrically connected to at least a portion of circuit elements included in the logic circuit LC of the second layer 40 by a bump, and may store information used for providing an autofocusing function. In an example embodiment, the bump may be configured as a microbump.

Referring to FIG. 3, an image sensor 3 in the example embodiment may include a first layer 60 and a second layer 70. The first layer 60 may include a sensing area SA in which a plurality of pixels PX are arranged, a logic circuit LC in which circuit elements for driving the plurality of pixels PX are arranged, and a first pad region PA1 arranged in a periphery of the sensing area SA and the logic circuit LC. A plurality of upper pads PAD may be included in the first pad region PA1, and the plurality of upper pads PAD may be connected to a memory chip MC arranged on the second layer 70 through a via. The second layer 70 may include a memory chip MC, a dummy chip DC, and a protective layer EN sealing the memory chip MC and the dummy chip DC.

Figure 4:
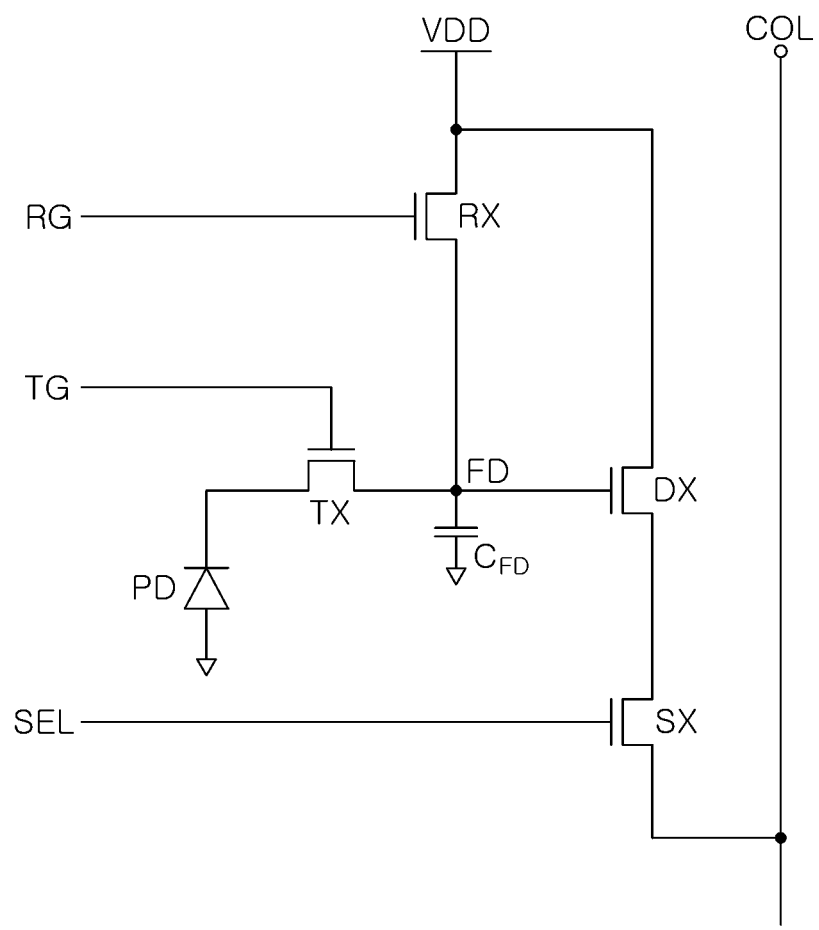
FIG. 4 is a circuit diagram illustrating a pixel circuit of a pixel included in an image sensor according to an example embodiment.

FIG. 4 is a circuit diagram illustrating a pixel circuit of a pixel included in an image sensor according to an example embodiment.

Referring to FIG. 4, a pixel PX in the example embodiment may include a plurality of transistors and a photodiode PD. A signal generated by transistors using an electric charge generated by the photodiode PD may be output through a column line COL.

The pixel PX may include a transfer transistor TX, a reset transistor RX, a drive transistor DX, a select transistor SX, and the like. The reset transistor RX may be turned on and turned off by a reset control signal RG. When the reset transistor RX is turned on, a voltage of a floating diffusion FD may be reset to a power voltage VDD. The transfer transistor TX may be controlled by a transfer control signal TG. When a voltage of the floating diffusion FD is reset, the select transistor SX may be turned on by a select control signal SEL and a reset voltage may be output to a column line COL.

In an example embodiment, a photodiode PD may generate an election or a hole as a main charge carrier in response to light. When a transfer transistor is turned on after a reset voltage is output to the column line COL, an electric charge generated by the photodiode PD being exposed to light may move to a capacitor CFD of the floating diffusion FD. The drive transistor DX may operate as a source-follower amplifier which amplifies a voltage of the floating diffusion FD, and when the select transistor SX is turned on by a select control signal SEL, a pixel voltage corresponding to an electric charge generated by the photodiode PD may be output to the column line COL.

Figure 5:
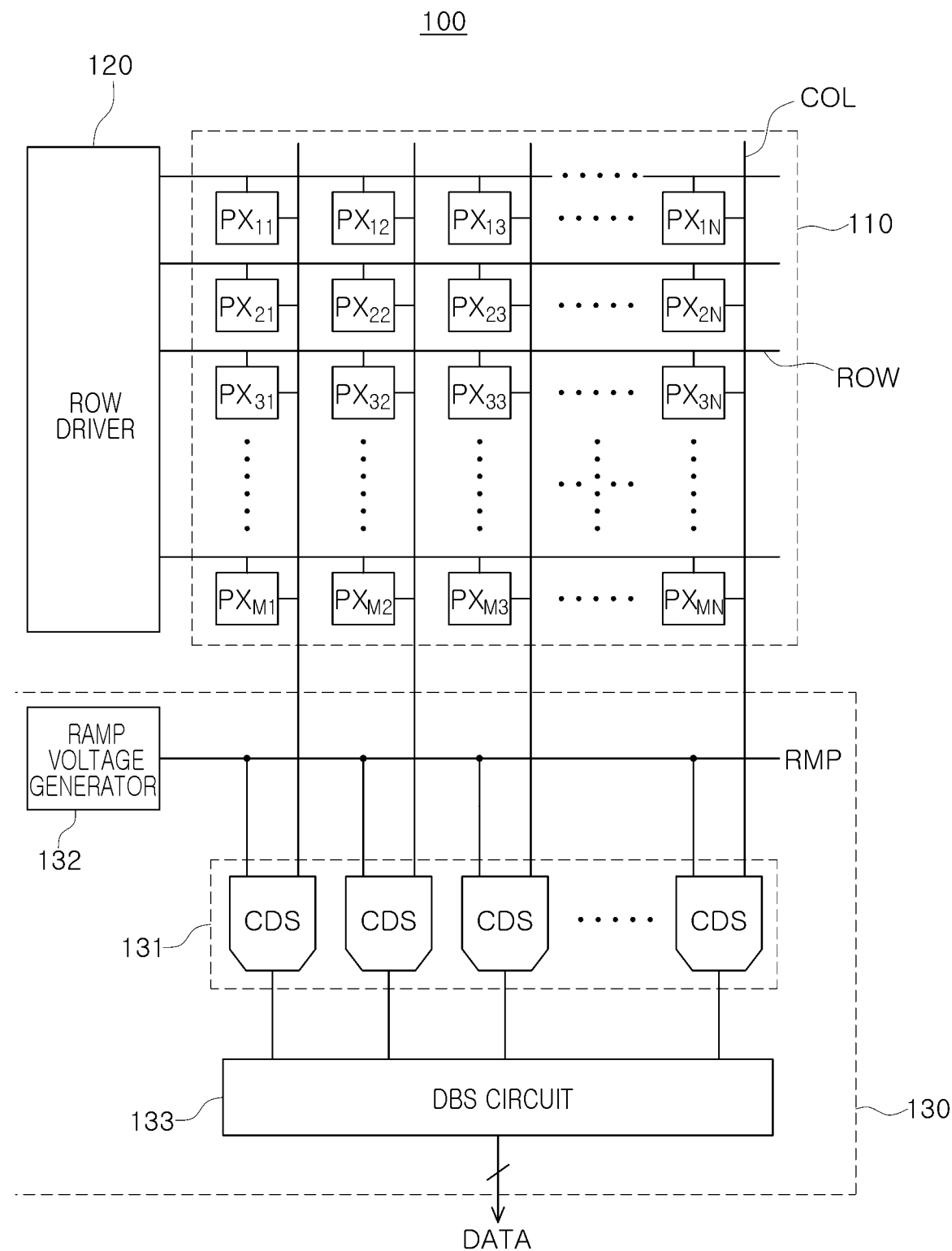
FIG. 5 is a block diagram illustrating an mage sensor according to an example embodiment.

FIG. 5 is a block diagram illustrating an image sensor according to an example embodiment.

Referring to FIG. 5, an image sensor 100 in the example embodiment may include a pixel array 110, and a controller for driving the pixel array 110. The controller may include a row driver 120, a read-out circuit 130, and the like. The readout circuit 130 may include a sampling circuit 131, a ramp voltage generator 132, a DBS circuit 133, and the like. The DBS circuit 133 may convert an output of the sampling circuit 131 to digital data DATA and may output the digital data DATA.

The pixel array 110 may include a plurality of pixels PX11 to PXMN arranged at intersecting points at which a plurality of row lines ROW intersect a plurality of column lines COL. The row driver 120 may input a signal used to control a plurality of pixels PX11 to PXMN through the plurality of row lines ROW. As an example, a signal input to the plurality of pixels PX11 to PXMN through the plurality of row lines ROW may include a reset control signal RG, a transfer control signal TG, a select control signal SEL, and the like, described with reference to FIG. 4 above. The row driver 120 may select the plurality of row lines ROW in sequence. The row driver 120 may select one of the plurality of row lines ROW during a certain horizontal period.

The sampling circuit 131 may obtain a reset voltage and a pixel voltage from some pixels of the plurality of pixels PX11 to PXMN connected to row line scanned by the row driver 120. The sampling circuit 131 may include a plurality of comparators CDS, and each of the comparators CDS may be a correlated double comparator. Each of the comparators CDS may include a first input terminal connected to one of the column lines COL, and a second input terminal receiving a ramp voltage RMP output by the ramp voltage generator 132. A reset voltage and a pixel voltage output by the plurality of pixels PX11 to PXMN may be input to a first input terminal.

Figure 6:
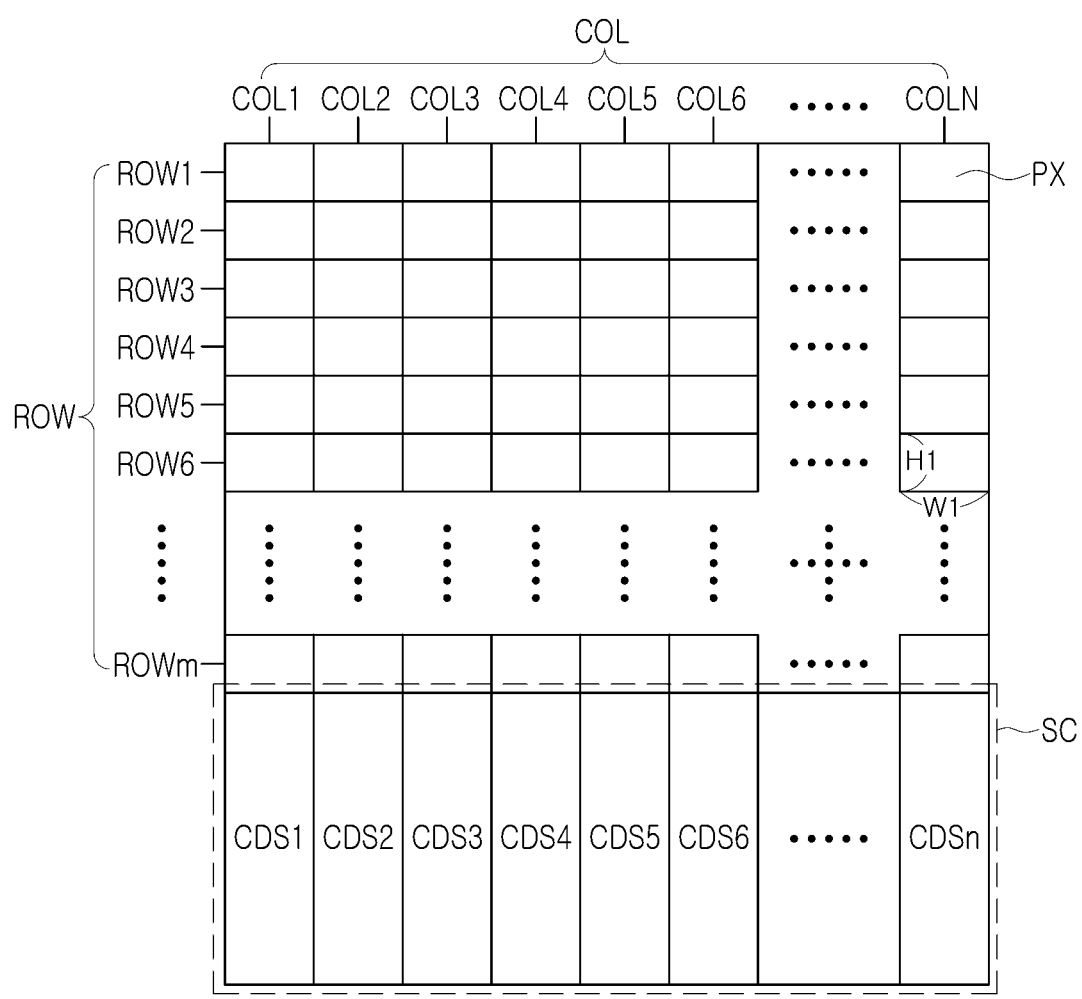
FIGS. 6 and 7 are diagrams illustrating a pixel array and sampling circuits included in an image sensor according to an example embodiment.
Figure 7:
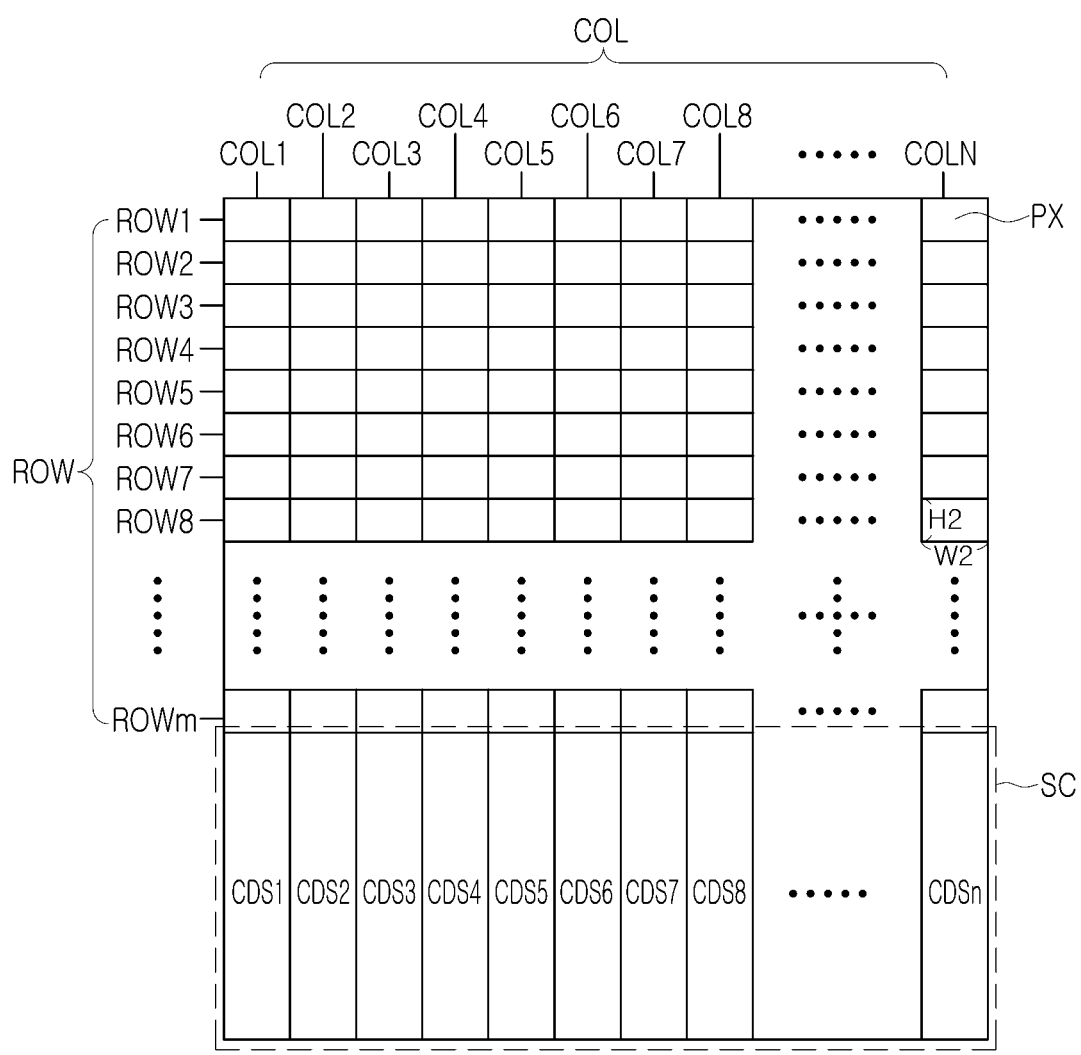

FIGS. 6 and 7 are diagrams illustrating a pixel array and sampling circuits included in an image sensor according to an example embodiment.

Referring to FIG. 6, in an image sensor 200A in the example embodiment, pixels PX may be arranged along a plurality of row lines ROW1 to ROWm (ROW) and a plurality of column lines COL1 to COLn (COL). Each of the pixels PX may have a first height H1 and a first width W1. The first width W1 may be a length of each of the pixels PX in a first direction in which the row lines ROW extend, and the first height H1 may be a length of each of the pixels PX in a second direction in which the column lines COL extend.

The pixels PX may be connected to a sampling circuit SC including a plurality of comparators CDS1 to CDSn. As an example, the sampling circuit SC may include comparators CDS1 to CDSn arranged in a first direction. Each of the plurality of comparators CDS1 to CDSn may be connected to one of the column lines COL. In an example embodiment, the comparators CDS1 to CDSn may be connected to the column lines COL disposed in the same position in the first direction.

Each of the comparators CDS1 to CDSn may include a plurality of transistors arranged in a second direction. As an example, transistors included in each of the comparators CDS1 to CDSn may be arranged only in a second direction. In other words, only one transistor may be disposed in the first direction in each of the comparators CDS1 to CDSn.

Referring to FIG. 7, in an image sensor 200B in the example embodiment, each of the pixels PX may have a second height H2 and a second width W2. Comparing FIG. 6 with FIG. 7, the first width W1 may be greater than the second width W2, and the first height H1 may be greater than the second height H2. Thus, the pixels PX of the image sensor 200A in the example embodiment illustrated in FIG. 6 may be larger than the pixels PX of the image sensor 200B in the example embodiment illustrated in FIG. 7.

A size of each of the pixels PX may be determined in accordance with a plate shape of each of the image sensors 200A and 200B, the number of the pixels PX included in the image sensors 200A and 200B, and the like. As an example, resolution of an image provided by the image sensors 200A and 200B may be determined in accordance with the number of the pixels PX included in the image sensors 200A and 200B.

Recently, as the demand has increased for image sensors such as image sensors 200A and 200B which may provide a high-resolution image, a size of each of the pixels PX has decreased. When a size of each of the pixels PX decreases, a width of each of the comparators CDS1 to CDSn connected to the column lines COL, taken in the first direction, may also decrease. The decrease of the width of each of the comparators CDS1 to CDSn may lead to a decrease of a size of each of transistors included in each of the comparators CDS1 to CDSn.

As a size of each of the transistors included in each of the comparators CDS1 to CDSn is decreased, a length of each of the transistors may be increased in the second direction to secure operation properties. However, when a length of each of the transistors increases in the second direction, the effects of parasitic capacitance caused by a coupling effect between comparators CDS1 to CDSn which are adjacent to each other in the first direction may also be increased. For example, transistors connected to a node in which relatively high voltage swing occurs may be greatly affected by parasitic capacitance.

In an example embodiment, a layout of the comparators CDS1 to CDSn may be changed to prevent a performance degradation of the image sensors 200A and 200B caused by an increase of a parasitic capacitance effect resulting from a coupling effect between the comparators CDS1 to CDSn due to a decrease of a size of each of the pixels PX. For example, the transistors greatly affected by parasitic capacitance may be disposed in different positions in the second direction between the comparators CDS1 to CDSn which are adjacent to each other in the first direction. Accordingly, a gap between the transistors greatly affected by parasitic capacitance may be increased, which may lead to a decrease in a coupling effect and parasitic capacitance such that performance of the image sensors 200A and 200B may improve.

Figure 8:
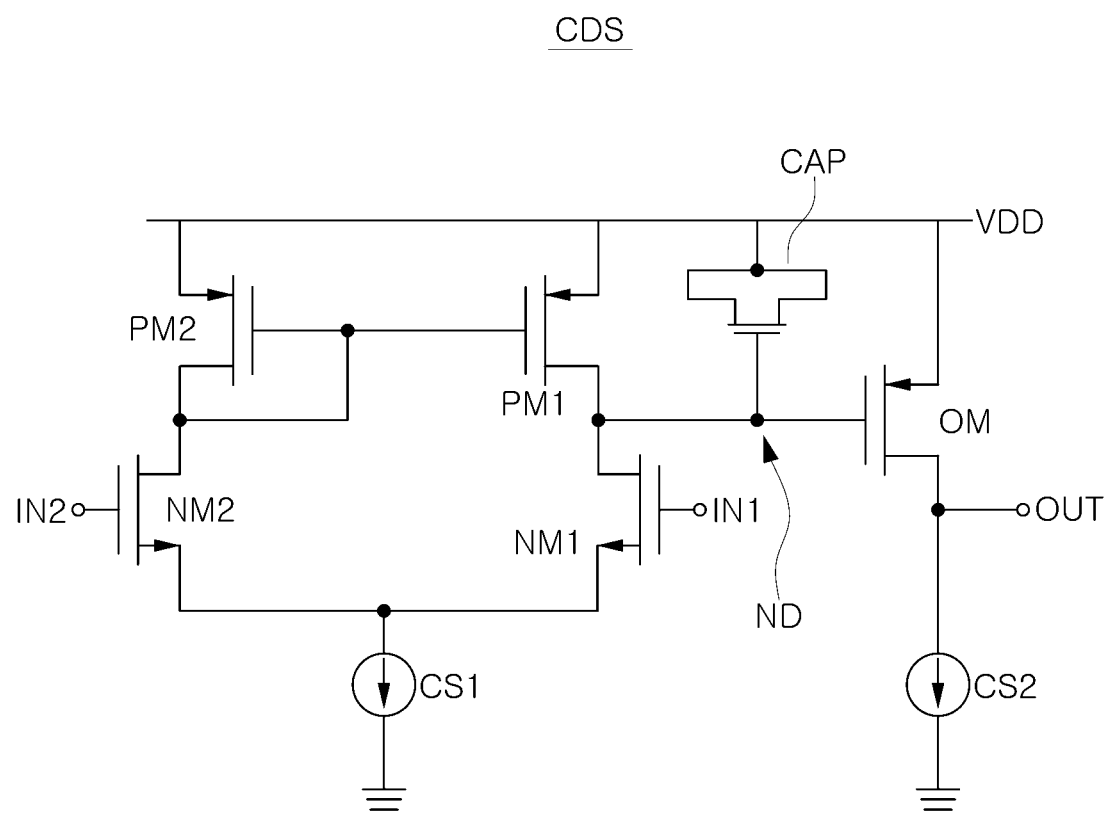
FIG. 8 is a circuit diagram illustrating a sampling circuit included in an image sensor according to an example embodiment.

FIG. 8 is a circuit diagram illustrating a comparator included in an image sensor according to an example embodiment.

In the example embodiment, a comparator CDS may be configured as a correlated double comparator, and may include a plurality of transistors. Referring to FIG. 8, the comparator CDS may include a first p-type metal-oxide-semiconductor (PMOS) transistor PM1, a second PMOS transistor PM2, a first n-type metal-oxide-semiconductor (NMOS) transistor NM1, a second NMOS transistor NM2, an output transistor OM, a metal-oxide-semiconductor (MOS) capacitor CAP, and others. The configuration of the comparator CDS and the number of the transistors may be varied in example embodiments. The first PMOS transistor PM1 and the second PMOS transistor PM2 may be connected to a first power node providing a power voltage VDD, and the first NMOS transistor NM1 and the second NMOS transistor NM2 may be connected to a first current source CS1 supplying a first bias current.

A gate of the first NMOS transistor NM1 may provide a first input terminal IN1 of the comparator CDS, and a gate of the second NMOS transistor NM2 may provide a second input terminal IN2 of the comparator CDS. In an example embodiment, the first input terminal IN1 may be connected to pixels of the image sensor through a column line, and the second input terminal IN2 may be connected to an output terminal of a ramp voltage generator generating a ramp voltage.

The first PMOS transistor PM1, the second PMOS transistor PM2, the first NMOS transistor NM1, and the second NMOS transistor NM2 may provide an amplifier circuit. In an example embodiment, the PMOS transistor PM1 and the second PMOS transistor PM2 may have the same size, and the first NMOS transistor NM1 and the second NMOS transistor NM2 may have the same size. The first and second PMOS transistors PM1 and PM2 may have the same size or different sizes, and the first and second NMOS transistors NM1 and NM2 may have the same size or different sizes.

The first PMOS transistor PM1 and the first NMOS transistor NM1 may be connected to the output transistor OM providing an output terminal OUT in a drain terminal. The output transistor OM may be implemented as a PMOS transistor, and the drain terminal of the output transistor OM may be connected to a second current source CS2 providing a second bias current. A source terminal of the output transistor OM may be connected to a first power node providing a power voltage VDD, and a gate terminal of the output transistor OM may be connected to a node ND between the first PMOS transistor PM1 and the first NMOS transistor NM1.

The comparator CDS may include an MOS capacitor CAP for limiting a bandwidth of an output signal. The MOS capacitor CAP may be implemented as a transistor, and a gate terminal of a transistor providing the MOS capacitor CAP may be connected to the node ND connected to a gate terminal of the output transistor OM. Accordingly, relatively high voltage swing may occur in the node ND as compared to the other nodes, and a relatively large coupling effect may occur in the MOS capacitor CAP and the output transistor OM as compared to the other transistors PM1, PM2, NM1, and NM2.

In an example embodiment, in each of the comparators CDS disposed adjacent to each other, at least one of a transistor providing the MOS capacitor CAP and the output transistor OM may be disposed in different positions. Accordingly, the transistors providing the MOS capacitor CAP and the output transistors OM may be disposed in a zigzag pattern in a sampling circuit including the plurality of comparators CDS, and a coupling effect may be reduced, along with a parasitic capacitance caused by the coupling effect.

Figure 9:
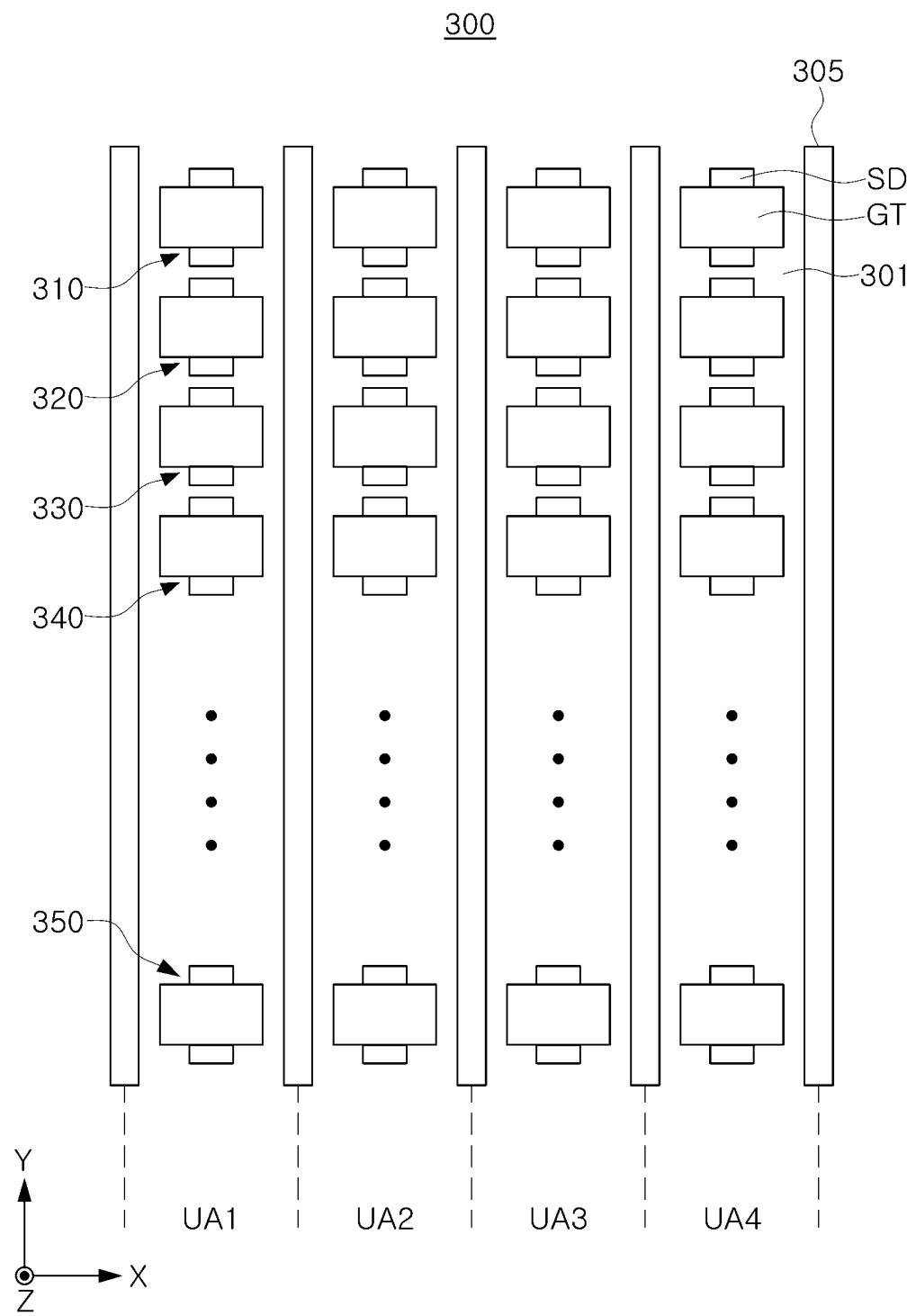
FIGS. 9 to 11 are diagrams illustrating a layout of a sampling circuit included in an image sensor according to an example embodiment.
Figure 10:
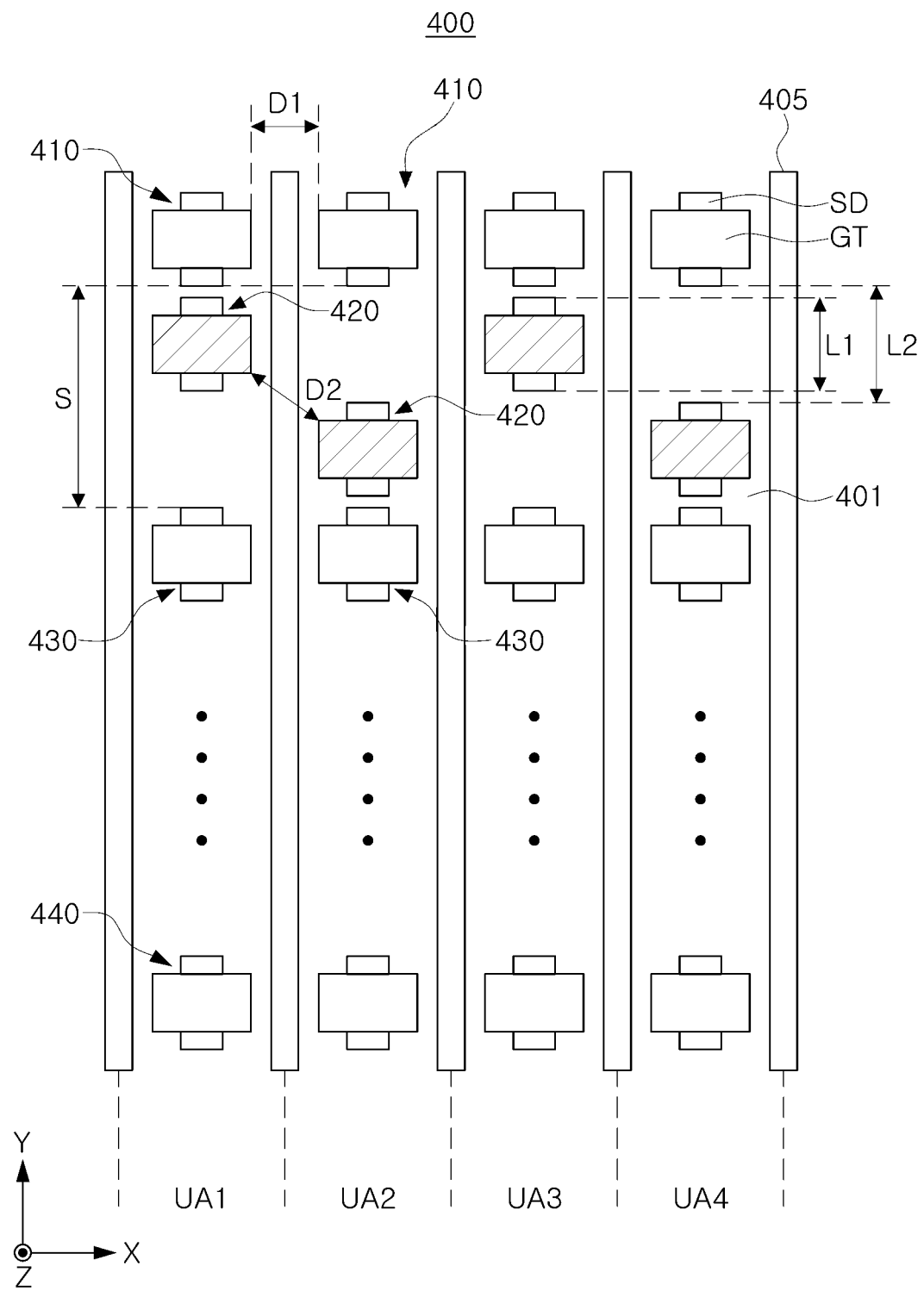
Figure 11:
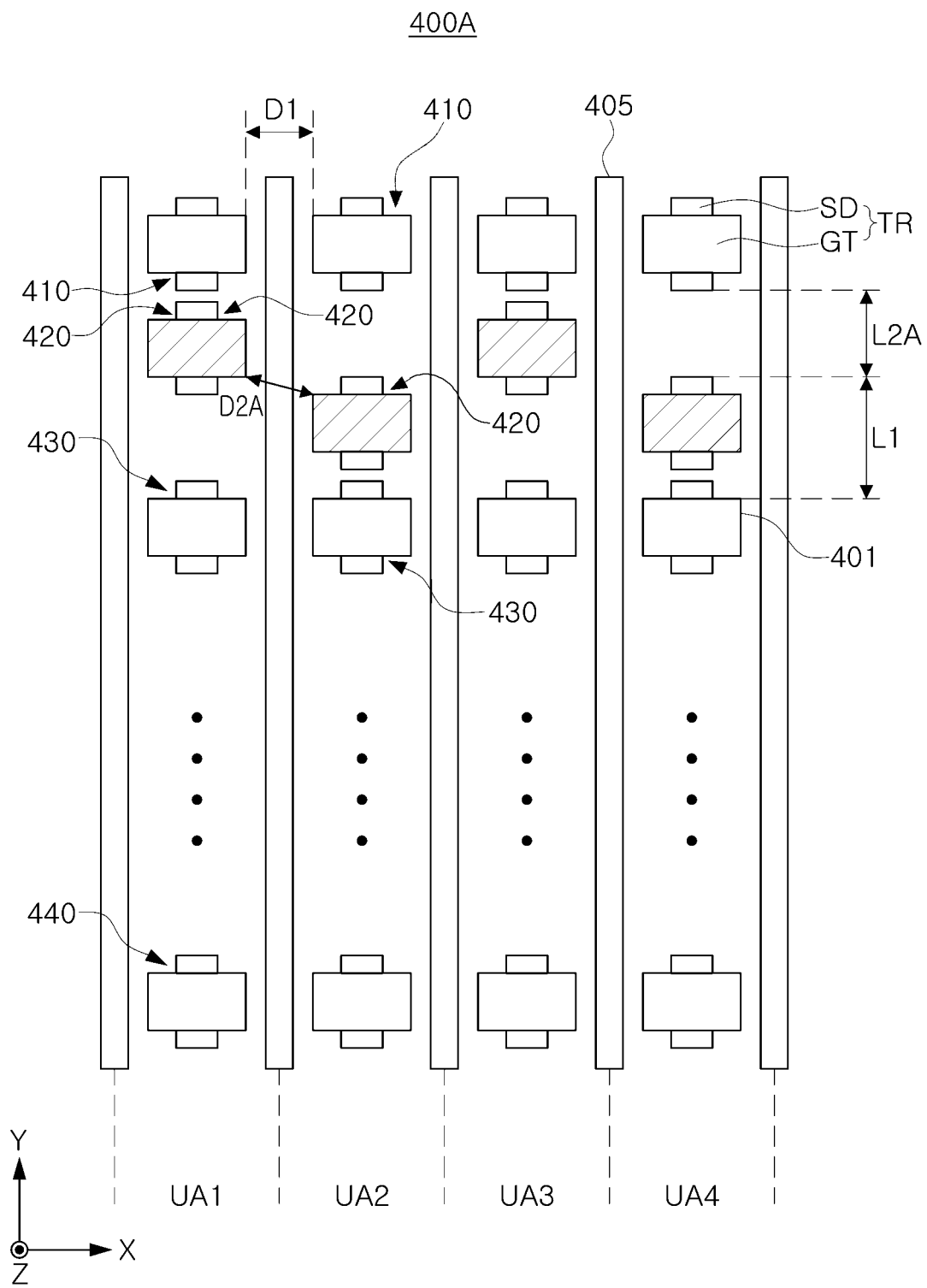

FIGS. 9 to 11 are diagrams illustrating a layout of a sampling circuit included in an image sensor according to an example embodiment.

FIG. 9 illustrates a comparative example illustrating an image sensor according to an example embodiment. In FIG. 9, a sampling circuit 300 of the image sensor may include comparators disposed in a plurality of unit regions UA1 to UA4 defined on a substrate 301. For example, a single comparator may be disposed in each of the unit regions UA1 to UA4, and a shield region 305 may be arranged among the unit regions UA1 to UA4.

A plurality of transistors 310 to 350 may be disposed in each of the unit regions UA1 to UA4. Each of the transistors 310 to 350 may include an active region SD and a gate electrode GT. The transistors 310 to 350 disposed in each of the unit regions UA1 to UA4 may provide a comparator. In the comparative example illustrated in FIG. 9, the transistors 310 to 350 may be disposed in the same order in each of the unit regions UA1 to UA4.

For example, when the second transistor 320 of the first unit region UA1 is configured as the transistor providing an MOS capacitor described with reference to FIG. 8, the second transistor 320 of the second unit region UA2 may also provide an MOS capacitor. Accordingly, a great level of coupling effect may be generated by voltage swing occurring in a gate electrode GT of the second transistor 320 disposed in the unit regions UA1 to UA4 while the image sensor operates. Due to the coupling effect, parasitic capacitance may increase, and consequently, operation properties of the image sensor may degrade.

In the example embodiments illustrated in FIGS. 10 and 11, the transistors in which high level of voltage swing occurs may be disposed in different positions in a first direction, which may correspond to the illustrated X axis direction, and a second direction, which may correspond to the illustrated Y axis direction. Referring to FIGS. 10 and 11, sampling circuits 400 and 400A may include comparators disposed in a plurality of unit regions UA1 to UA4 defined on a substrate 401. A single comparator may be disposed in each of the unit regions UA1 to UA4. A plurality of transistors 410 to 440 may be disposed in each of the unit regions UA1 to UA4, and each of the transistors 410 to 440 may include an active region SD and a gate electrode GT. A shield region 405 may be arranged among the unit regions UA1 to UA4.

The shield region 405 may have a plurality of portions divided from one another in the second direction. As an example, the shield region 405 may receive a voltage in accordance with a type of a transistor adjacent to the shield region 405 in the first direction. As an example, the portion of the shield region 405 adjacent to an NMOS transistor in the first direction may receive a ground voltage, and the portion of the shield region 405 adjacent to a PMOS transistor in the first direction may receive a power voltage. The power voltage may be configured as a power voltage VDD described with reference to FIG. 8.

In the description below, the comparators disposed in the unit regions UA1 to UA4 will be referred to as first to fourth comparators. The first to fourth comparators may be configured to connect to a pixel array through first to fourth column lines.

In the example embodiments illustrated in FIGS. 10 and 11, a second transistor 420 may be configured as the transistor that provides the MOS capacitor described with reference to FIG. 8. In the example embodiment illustrated in FIGS. 10 and 11, the second transistors 420 may be disposed in a zigzag pattern, which may refer to, for example, an alternating pattern. In other words, the second transistors 420 included in the first and second comparators adjacent to each other in the first direction, respectively, may be disposed in different positions in the first direction and the second direction.

The configuration described above may relate to odd comparators connected to odd-numbered column lines and even comparators connected to even-numbered column lines. For example, the second transistor 420 providing an MOS capacitor in the odd comparators may be disposed in a first position in the second direction, and the second transistor 420 providing an MOS capacitor in the even comparators may be disposed in a second position different from the first position in the second direction. Referring to FIGS. 10 and 11, transistors may not be disposed in the second position of the odd comparators, and the transistors may not be disposed in the first position of the even comparators as well.

As only the second transistors 420 are disposed in the zigzag pattern, a gap S between the first transistor 410 and the third transistor 430 in each of the first to fourth comparators may be the same. Also, the other transistors 410, 430, and 440 may each be disposed in the same position in each of the unit regions UA1 to UA4 in the second direction. For example, the third transistor 430 of the first comparator and the corresponding third transistor 430 of the second comparator may be disposed in the same position in the second direction.

Also, because only the second transistors 420 are disposed in a zigzag pattern, in the example embodiments illustrated in FIGS. 10 and 11, the sizes of the areas in which the first to fourth comparators are disposed in the unit regions UA1 to UA4 may be the same. In other words, sizes of areas of the unit regions UA1 to UA4 for forming the first to fourth comparators may be the same.

Because the second transistors 420 are disposed in a zigzag pattern, a gap between the second transistor 420 and the third transistor 430 included in the first comparator may be different from a gap between the second transistor 420 and the third transistor 430 included in the second comparator. In the example embodiments illustrated in FIGS. 10 and 11, a gap between the second transistor 420 and the third transistor 430 included in the first comparator may be greater than a gap between the second transistor 420 and the third transistor 430 included in the second comparator.

Referring to FIG. 10, a gap between the second transistors 420 included in each pair of comparators adjacent to each other in the first direction may be defined as a second gap D2, and the second gap D2 may be greater than a first gap D1 between the first transistors 410. Accordingly, a coupling effect and a parasitic capacitance effect between the second transistors 420 may be reduced. Also, in the example embodiment illustrated in FIG. 10, a length L1 of the second transistor 420 included in the odd comparators, taken in the second direction, may be smaller than a gap S2 between the first transistors 410 and the second transistor 420 included in the even comparators.

In the example embodiment illustrated in FIG. 11, a second gap D2A between the second transistors 420 included in each pair of comparators adjacent to each other in the first direction may be smaller than the example illustrated in FIG. 10. That is because, as illustrated in FIG. 11, a portion of the active region SD of the second transistors 420 included in each pair of comparators adjacent to each other in the first direction may be disposed in the same position in the second direction. Also, a gap L2A between the first transistors 410 and the second transistor 420 included in the even comparators may be smaller than the example embodiment illustrated in FIG. 10. In the example embodiment illustrated in FIG. 11, the gap L2A between the first transistors 410 and the second transistor 420 included in the even comparators may be smaller than the length L1 of the second transistor 420 included in the odd comparators, taken in the second direction.

Figure 12:
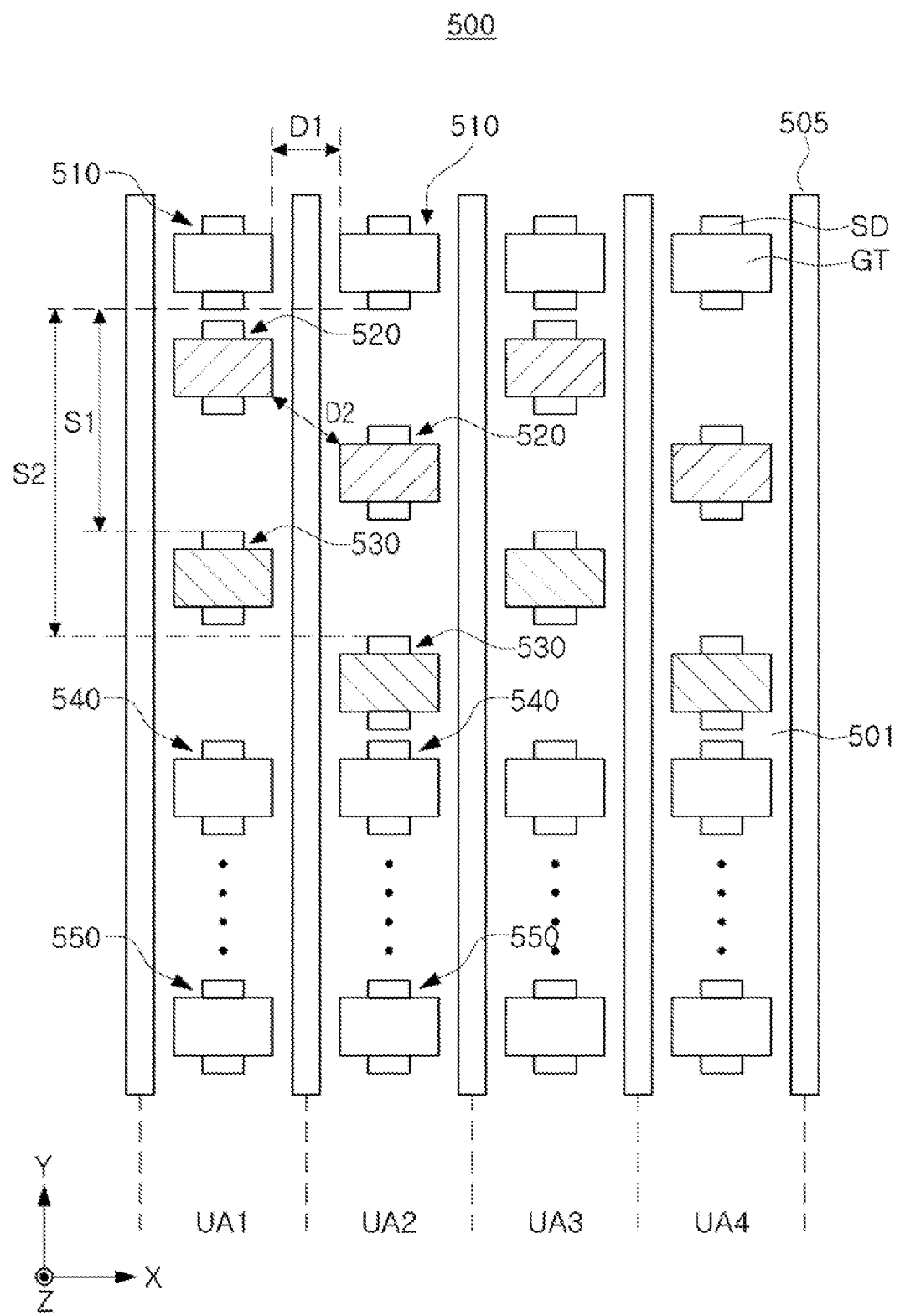
FIGS. 12 and 13 are diagrams illustrating a layout of a sampling circuit included in an image sensor according to an example embodiment.
Figure 13:
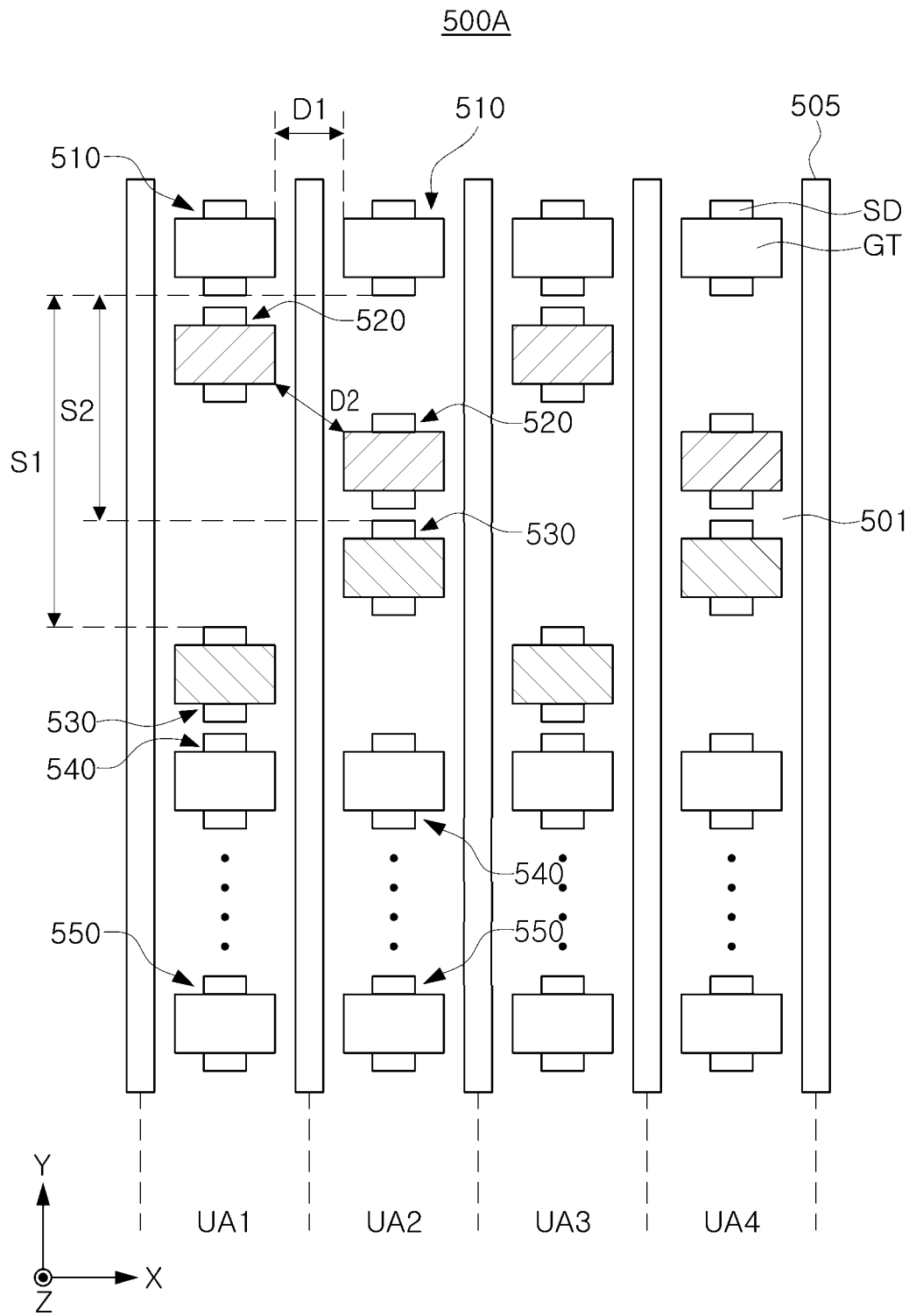

FIGS. 12 and 13 are diagrams illustrating a layout of a sampling circuit included in an image sensor according to an example embodiment.

Referring to FIGS. 12 and 13, sampling circuits 500 and 500A may include comparators disposed in a plurality of unit regions UA1 to UA4 defined on a substrate 501. First to fourth comparators may be disposed in the unit regions UA1 to UA4. A plurality of transistors 510 to 550 may be disposed in each of the unit regions UA1 to UA4, and each of the plurality of transistors 510 to 550 may include an active region SD and a gate electrode GT. A shield region 505 may be arranged among the unit regions UA1 to UA4.

In the example embodiments illustrated in FIGS. 12 and 13, the second transistors 520 and the third transistors 530 may be disposed in a zigzag pattern. For example, each of the second transistors 520 may be configured as a transistor providing an MOS capacitor, and each of the third transistors 530 may be configured as an output transistor of each of the comparators. Accordingly, a gap between the second transistors 520 and a second gap D2 between the third transistors 530 may be greater than a first gap D1 among the other transistors 510, 540, and 550. Regardless of the configuration in which the second transistors 520 and the third transistors 530 are disposed in a zigzag pattern, the sizes of the areas in which the first to fourth comparators are disposed in each of the unit regions UA1 to UA4 may be the same.

In the example embodiments illustrated in FIGS. 12 and 13, a gap S1 between a first transistor 510 and a third transistor 530 of a first comparator may be different from a gap S1 between a first transistor 510 and a third transistor 530 of a second comparator in the second direction. In other words, the gap S1 between the first transistor 510 and the third transistor 530 in each of odd comparators may be different from the gap S2 between the first transistor 510 and a third transistor 530 in each of even comparators.

In the example embodiment illustrated in FIG. 12, second transistors 520 and the third transistors 530 may be disposed in a zigzag pattern in the same manner. Accordingly, a gap between a second transistor 520 and the third transistor 530 of the first comparator may be the same as a gap between the second transistor 520 and the third transistor 530 of the second comparator in the second direction. Also, a gap between a second transistor 520 and a third transistor 530 included in the first comparator may be the same as a gap between the first transistor 510 and the second transistor 520 included in the second comparator in the second direction.

In the example embodiment illustrated in FIG. 13, the second transistors 520 and the third transistors 530 may be disposed in a zigzag pattern in a manner that is different from the manner illustrated in FIG. 12. Accordingly, a gap between the second transistor 520 and the third transistor 530 of the first comparator may be different from a gap between the second transistor 520 and the third transistor 530 of the second comparator in the second direction. Also, a gap between the second transistor 520 and the third transistor 530 included in the first comparator may be different from a gap between the first transistor 510 and the second transistor 520 included in the second comparator in the second direction.

Figure 14:
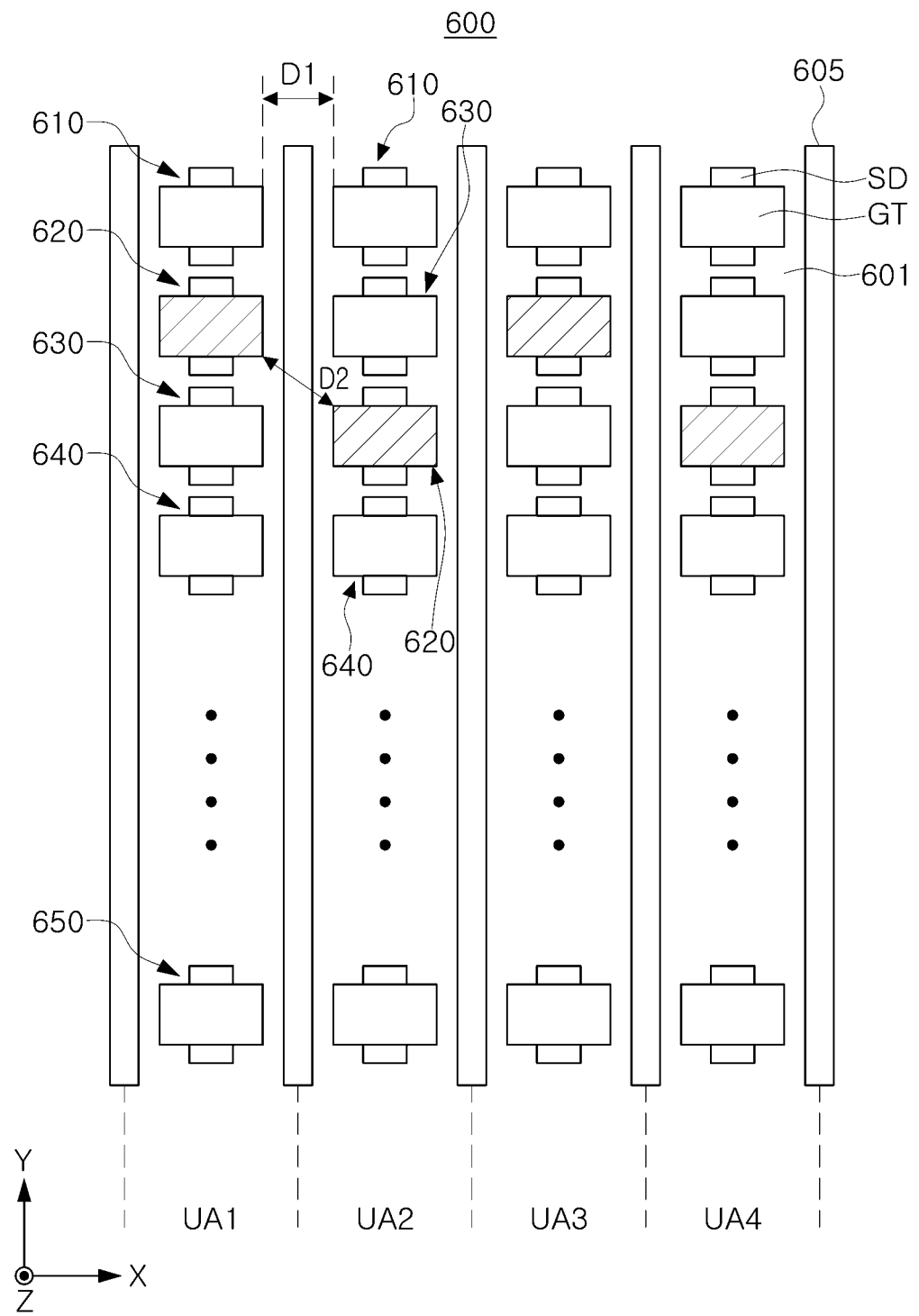
FIGS. 14 to 16 are diagrams illustrating a layout of a sampling circuit included in an image sensor according to an example embodiment.
Figure 15:
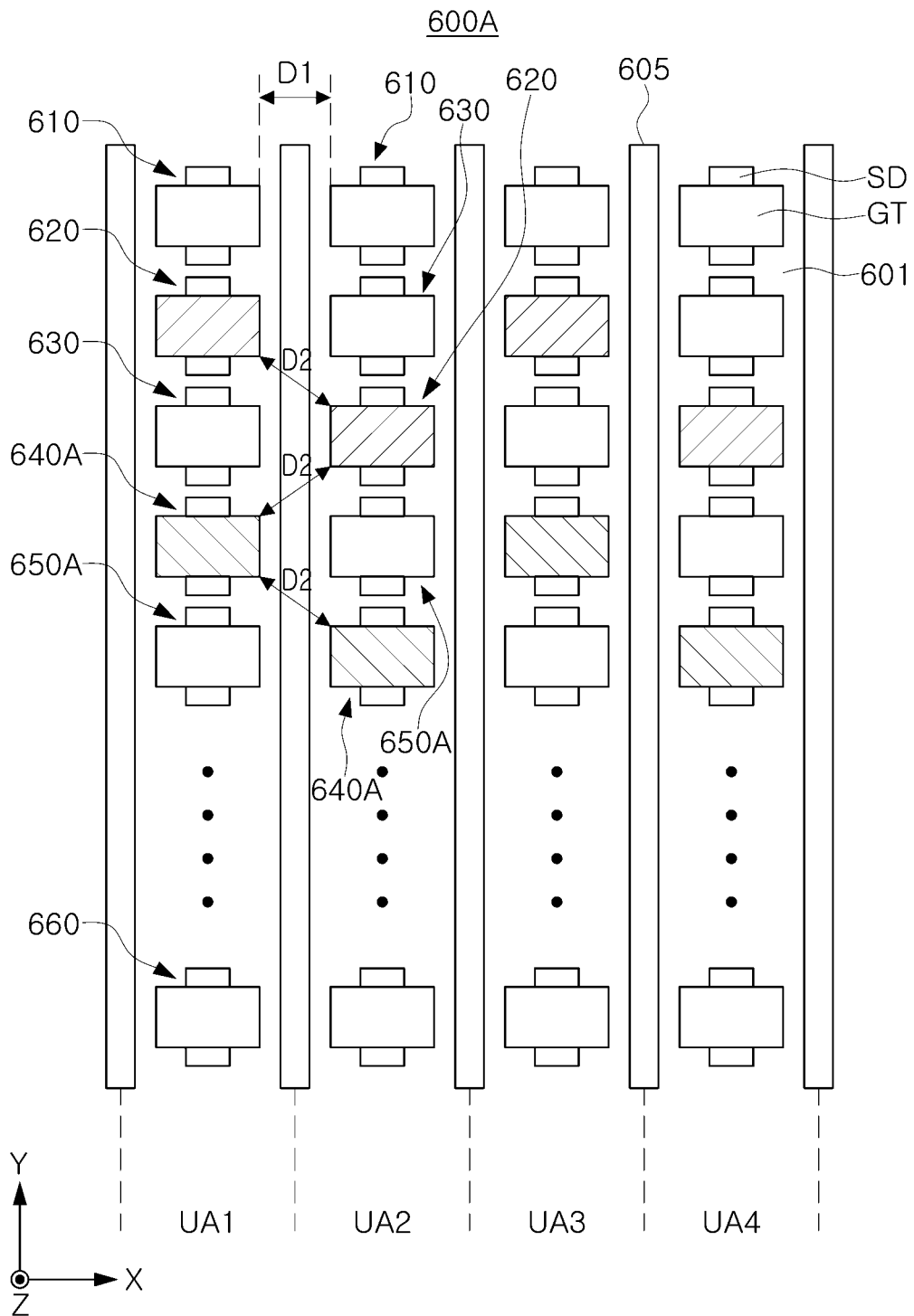
Figure 16:
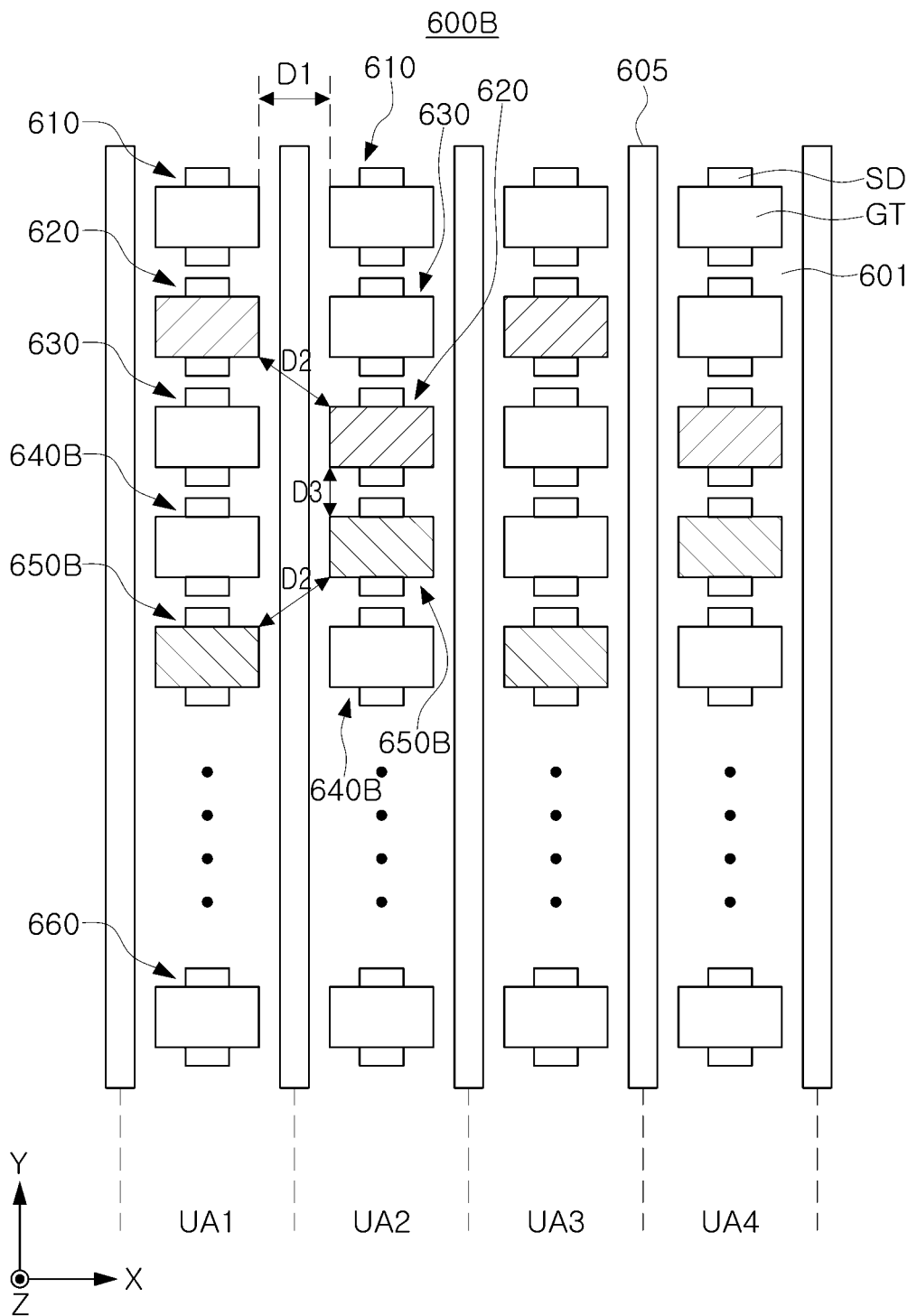

FIGS. 14 to 16 are diagrams illustrating a layout of a sampling circuit included in an image sensor according to an example embodiment.

Referring to FIGS. 14 to 16, sampling circuits 600, 600A, and 600B may include comparators disposed in a plurality of unit regions UA1 to UA4 defined on a substrate 601. First to fourth comparators may be disposed in the unit regions UA1 to UA4. A plurality of transistors may be disposed in each of the unit regions UA1 to UA4, and each of the transistors may include an active region SD and a gate electrode GT. A shield region 605 may be arranged among the unit regions UA1 to UA4.

In the example embodiment illustrated in FIG. 14, each of the first to fourth comparators may include transistors 610 to 650. A dispositional layout of transistors 610 to 650 included in each of odd comparators may be different from a dispositional layout of transistors 610 to 650 included in each of even comparators. Referring to FIG. 14, the second transistor 620 may be disposed between the first transistor 610 and the third transistor 630 in the first comparator included in unit region UA1, whereas the second transistor 620 may be disposed between the third transistor 630 and the fourth transistor 640 in the second comparator included in unit region UA2.

In other words, in the example embodiment illustrated in FIG. 14, the second transistors 620 provided to an MOS capacitor and/or an output transistor in which high level of voltage swing occurs may be disposed in a zigzag pattern, and the third transistors 630 may also be disposed in a zigzag pattern similarly to the disposition of the second transistors 620. Accordingly, the second transistors 620 of each of the odd comparators may be adjacent to the third transistors 630 of the even comparators in the first direction, which may correspond to the illustrated X axis direction. Also, the second transistors 620 of each of the even comparators may be adjacent to the third transistors 630 of the odd comparators in the first direction.

In the example embodiment illustrated in FIG. 15, each of the first to fourth comparators may include transistors 610, 620, 630, 640A, 650A, and 660, and the dispositional layout of the transistors 610, 620, 630, 640A, 650A, and 660 included in each of the odd comparators may be different from the dispositional layout of the transistors 610 to 650 included in each of the even comparators. Also, in the example embodiment illustrated in FIG. 15, the fourth transistor 640A providing an output transistor may be disposed in a zigzag pattern along with the second transistor 620 providing an MOS capacitor.

Similarly to FIG. 14, in the example embodiment illustrated in FIG. 15, the second transistors 620 provided to the MOS capacitor in which high level of voltage swing occurs and the fourth transistors 640A provided to an output transistor may be disposed in a zigzag pattern, and the third transistors 630 and the fifth transistors 650A may also be disposed in a zigzag pattern, similarly to the disposition of the aforementioned transistors. Accordingly, without increasing areas of the unit regions UA1 to UA4 in which the first to fourth comparators are disposed, a second gap D2 between the second transistor 620 and the fourth transistors 640A may be larger than a first gap D1 between the other transistors.

In the example embodiment illustrated in FIG. 15, the second transistor 620 and the fourth transistors 640A are disposed in a zigzag pattern in the same manner. In contrast, in the example embodiment illustrated in FIG. 16, the second transistor 620 and the fourth transistors 640A may be disposed in a zigzag pattern in different manners. Referring to FIG. 16, the third and fourth transistors 630 and 640B may be disposed between the second transistor 620 and the fifth transistor 650B in the odd comparators, whereas the second and fifth transistors 620 and 650B may be disposed between the third transistor 630 and the fourth transistors 640A in the even comparators. Also, in the example embodiment illustrated in FIG. 16, a third gap D3 between the second transistor 620 and the fifth transistor 650B in the even comparators may be smaller than a gap between the second transistor 620 and the fifth transistor 650B in the odd comparators.

Figure 17:
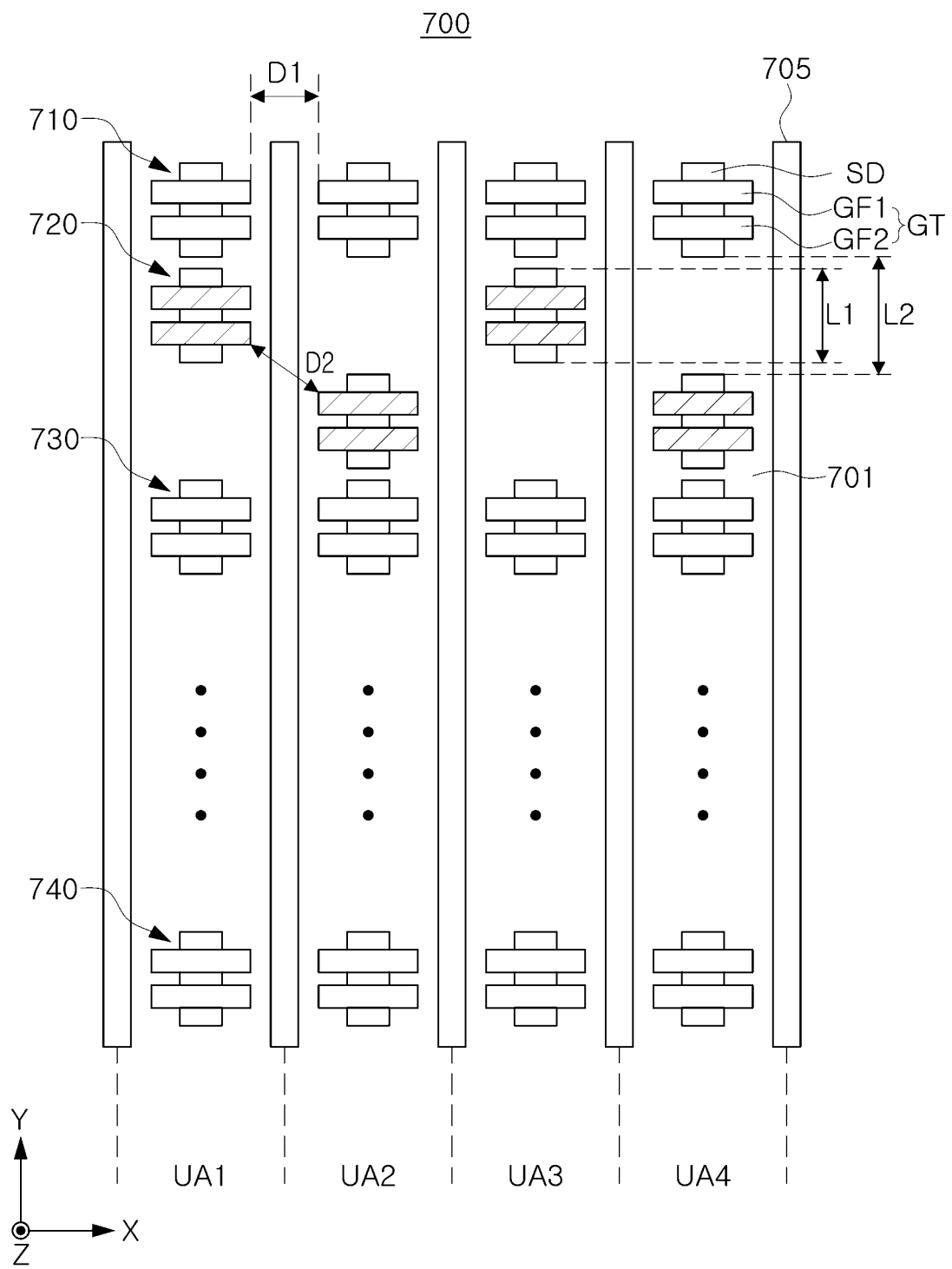
FIGS. 17 and 18 are diagrams illustrating a layout of a sampling circuit included in an image sensor according to an example embodiment.
Figure 18:
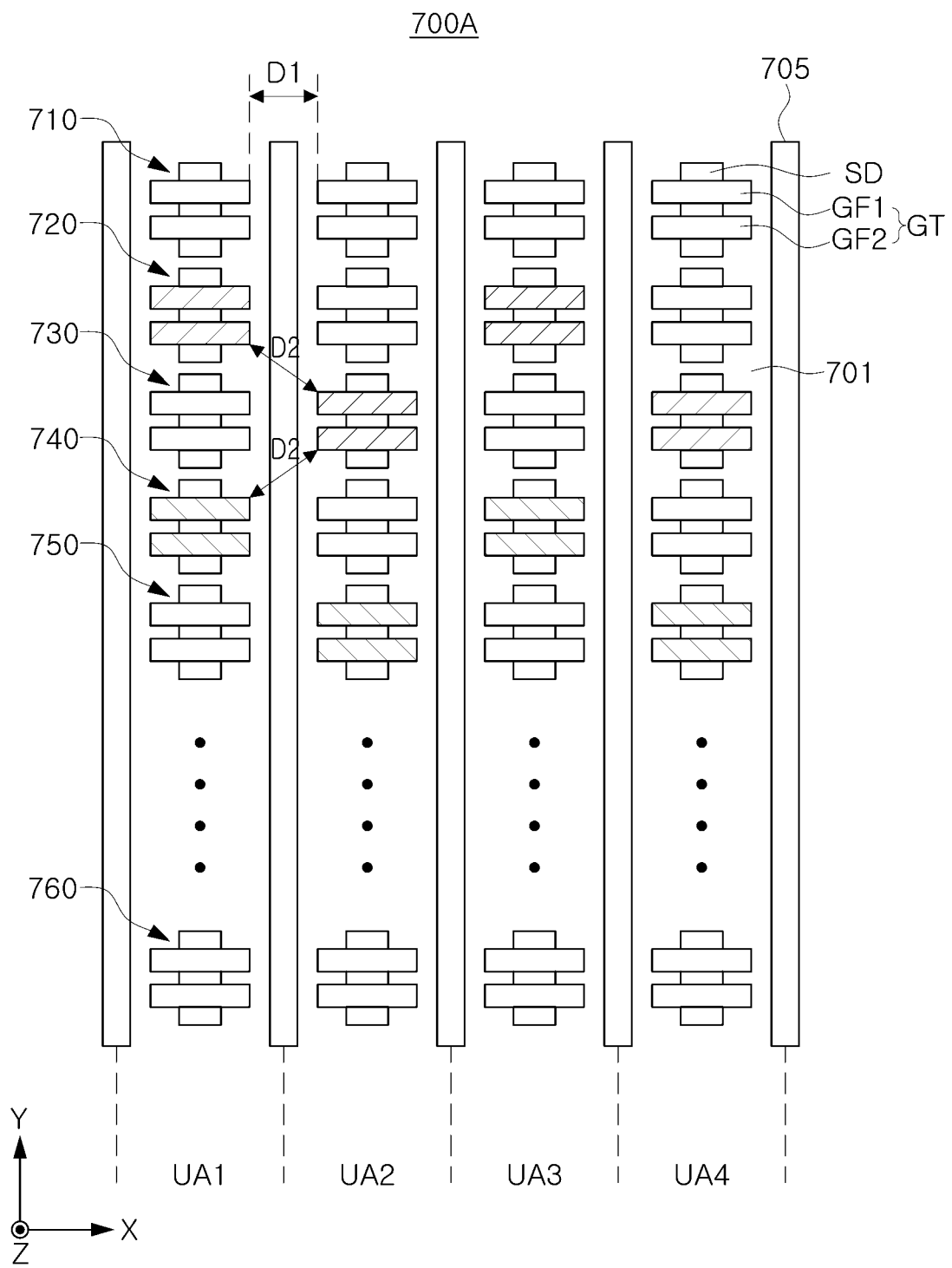

FIGS. 17 and 18 are diagrams illustrating a layout of a sampling circuit included in an image sensor according to an example embodiment.

Referring to FIGS. 17 and 18, sampling circuits 700 and 700A in the example embodiment may include comparators disposed in a plurality of unit regions UA1 to UA4 defined on a substrate 701. First to fourth comparators may be disposed in the unit regions UA1 to UA4. A plurality of transistors may be disposed in each of the unit regions UA1 to UA4, and each of the transistors may include an active region SD and a gate electrode GT. A shield region 705 may be arranged between the unit regions UA1 to UA4.

In the example embodiments illustrated in FIGS. 17 and 18, a gate electrode GT of each of the transistors may include a first gate finger GF1 and a second gate finger GF2. The first gate finger GF1 and the second gate finger GF2 may be separated from each other in the second direction, which may correspond to the illustrated Y axis direction, and may be connected to each other by a metal wiring formed thereon in a third direction, which may correspond to the illustrated Z axis direction, and may receive a single voltage. In example embodiments, the gate electrode GT may include two or more gate fingers GF1 and GF2.

Referring to FIG. 17, second transistors 720 of the transistors 710 to 740 may be disposed in a zigzag pattern. Accordingly, a second gap D2 between the second transistors 720 included in a pair of comparators adjacent to each other in the first direction, which may correspond to the illustrated X axis direction, may be greater than a first gap D1 between the other transistor, the first transistors 710, for example. The second transistors 720 may be configured as MOS capacitors in which relatively high level of voltage swing occurs, or output transistors. Accordingly, by enlarging the second gap D2 between the second transistors 720, a coupling effect and parasitic capacitance may be reduced. Also, in the example embodiment illustrated in FIG. 17, a length L1 of the second transistor 720 included in odd comparators, taken in the second direction, may be smaller than a gap L2 between the first transistor 710 and the second transistor 720 included in even comparators.

In the example embodiment illustrated in FIG. 18, the second transistors 720 and the fourth transistors 740 may be disposed in a zigzag pattern. As an example, each of the second transistors 720 may be configured as an MOS capacitor, and the fourth transistors 740 may be configured as output transistors. Also, the third transistors 730 and the fifth transistors 750 may be disposed in spaces formed by disposing the second transistors 720 and the fourth transistors 740 in a zigzag pattern. Accordingly, the third transistors 730 and the fifth transistors 750 may also be disposed in a zigzag pattern.

In the example embodiment illustrated in FIG. 18, by filling the spaces formed by disposing the second transistors 720 and the fourth transistors 740 in a zigzag pattern with the third transistors 730 and the fifth transistors 750, a gap between the second transistors 720 and the fourth transistors 740 may be secured as the second gap D2. In example embodiments, the other transistors may also be disposed between the second transistors 720 and the fourth transistors 740 in each of the unit regions UA1 to UA4 in addition to the third transistor 730.

Figure 19:
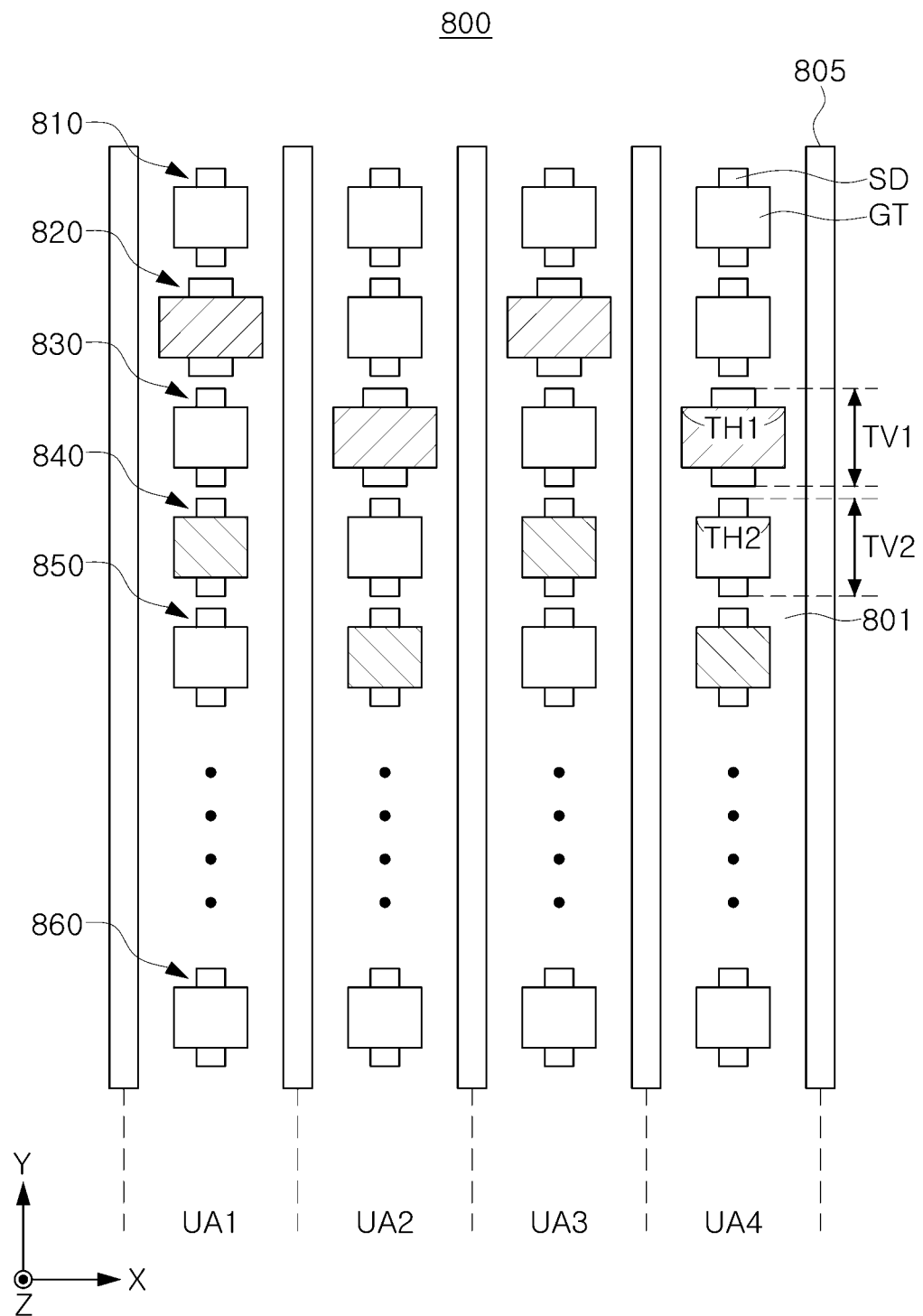
FIGS. 19 and 20 are diagrams illustrating a layout of a sampling circuit included in an image sensor according to an example embodiment.
Figure 20:
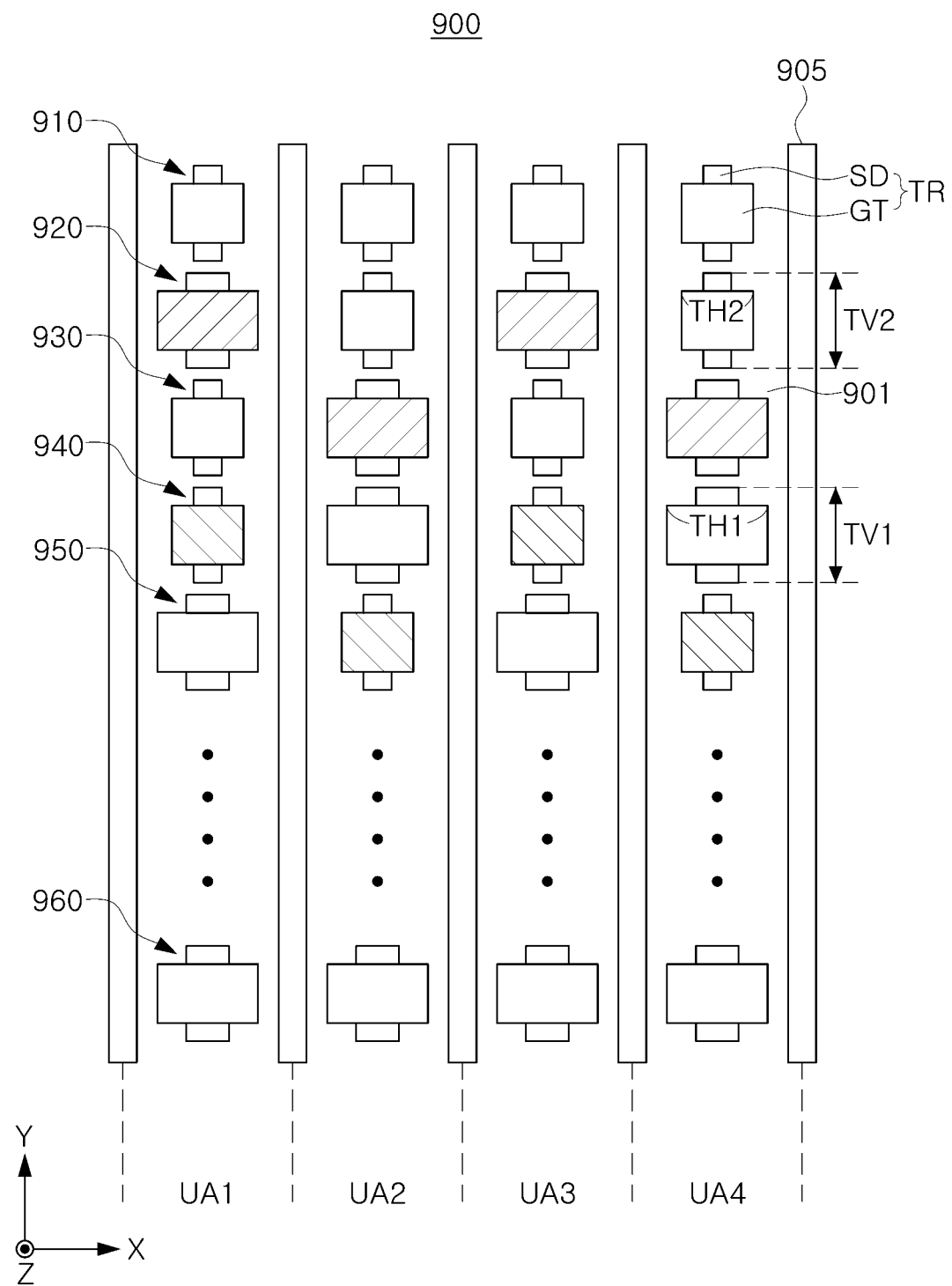

FIGS. 19 and 20 are diagrams illustrating a layout of a sampling circuit included in an image sensor according to an example embodiment.

Referring to FIGS. 19 and 20, sampling circuits 800 and 900 in the example embodiment may include comparators disposed in a plurality of unit regions UA1 to UA4 defined on substrates 801 and 901. First to fourth comparators may be disposed in the unit regions UA1 to UA4. A plurality of transistors may be disposed in each of the unit regions UA1 to UA4. Each of the transistors may include an active region SD and a gate electrode GT. Shield regions 805 and 905 may be arranged among the unit regions UA1 to UA4.

Referring to FIG. 19, the second transistors 820 and the fourth transistors 840 may be disposed in a zigzag pattern. Each of the second transistors 820 may provide an MOS capacitor, and each of the fourth transistors 840 may provide an output transistor. As an example, a layout of the sampling circuit 800 in the example embodiment illustrated in FIG. 19 may be understood with reference to the example embodiments illustrated in FIGS. 15 and 18.

In the example embodiment illustrated in FIG. 19, each of the second transistors 820 may have a size greater than sizes of the other transistors 810 and 830 to 860. As an example, a first horizontal length TH1 of each of the second transistors 820 in the first direction, which pray correspond to the illustrated X axis direction, may be greater than a second horizontal length TH2 of each of the other transistors 810 and 830 to 860 in the first direction. Also, a first vertical length TV1 of each of the second transistors 820 in the second direction, which may correspond to the illustrated Y axis direction, may be greater than a second vertical length TV2 of each of the other transistors 810 and 830 to 860 in the second direction. In example embodiments, the first horizontal length TH1 of each of the second transistors 820 may be the same as the second horizontal length TH2 of each of the other transistors 810 and 830 to 860, or the first vertical length TV1 of each of the second transistors 820 may be the same as the second vertical length TV2 of each of the other transistors 810 and 830 to 860.

Referring to FIG. 20, second transistors 920 and fourth transistors 940 may be disposed in in a zigzag pattern. Similarly to the example embodiment illustrated in FIG. 19, each of the second transistors 920 may provide an MOS capacitor, and each of the fourth transistors 940 may provide an output transistor. As an example, a layout of the sampling circuit 900 in the example embodiment illustrated in FIG. 20 may be understood with reference to the example embodiments illustrated in FIGS. 15 and 18.

In the example embodiment illustrated in FIG. 20, each of the second transistors 920 may have a size the same as a size of each of fifth and sixth transistors 950 and 960, and each of the fourth transistors 940 may have a size the same as a size of each of the third transistors 910 and 930. As an example, the fifth and sixth transistors 950 and 960 may be configured as PMOS transistors, and the first and third transistors 910 and 930 may be configured as NMOS transistors. A size of each of the transistors 910 to 960 included in the comparators, however, is not limited to the example described with reference to FIG. 20, and may be varied in example embodiments.

Figure 21:
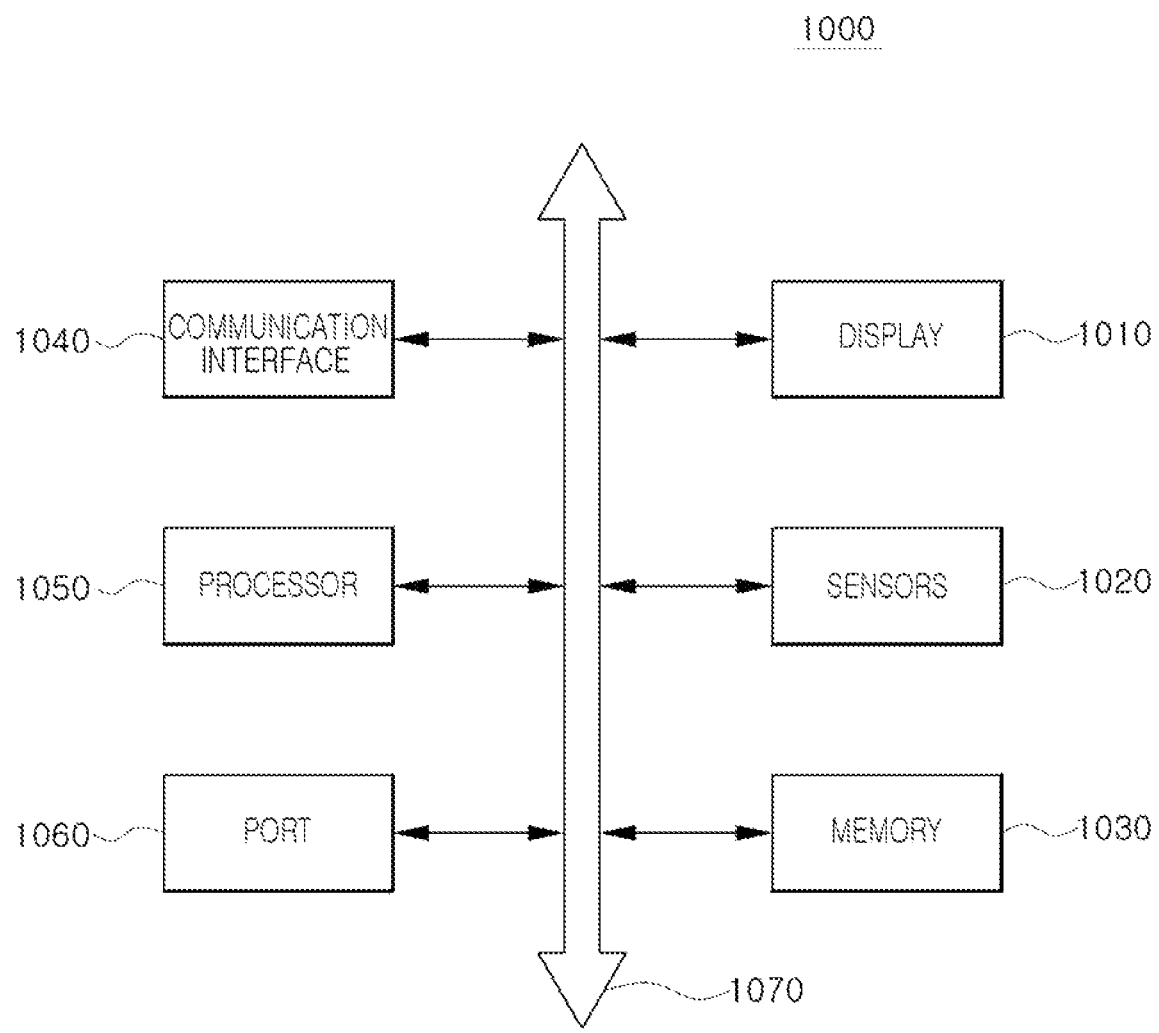
FIG. 21 is a block diagram illustrating an electronic device including an image sensor according to an example embodiment.

FIG. 21 is a block diagram illustrating an electronic device including an image sensor according to an example embodiment.

An electronic device 1000 in the example embodiment illustrated in FIG. 21 may include a display 1010, one or more sensors 1020, a memory 1030, a communication interface 1040, a processor 1050, a port 1060, and others. The electronic device 1000 may further include a power device, an input and output device, and others. Among the elements illustrated in FIG. 21, the port 1060 may be provided for the electronic device 1000 to communicate with a video card, a sound card, a memory card, a USB device, and others. The electronic device 1000 may include a general desktop computer and a laptop computer, and also include a smartphone, table PC, a smart wearable device, and the like.

The processor 1050 may perform a certain calculation or may process a command word, a task, or the like. The processor 1050 may be implemented as a central processing unit (CPU), a microprocessor unit (MCU), a system on chip (SoC), or the like, and may communicate with the display 1010, the sensors 1020, and the memory 1030, and the communication interface 1040, and with other devices connected to the port 1060, through a bus 1070.

The sensors 1020 may include a plurality of sensors collecting ambient information. For example, the sensors 1020 may include an acoustic sensor, an image sensor, a GPS sensor, and the like. In the example embodiment illustrated in FIG. 21, an image sensor included in the sensors 1020 may be implemented by image sensors described in the example embodiments with reference to FIGS. 1 to 20.

The memory 1030 may be a storage medium storing data used to operate the electronic device 1000, multimedia data, or the like. The memory 1030 may include a volatile memory such as a random access memory (RAM), or a non-volatile memory such as a flash memory, or the like. The memory 1030 may include at least one of a solid state drive (SSD), a hard disk drive (HDD), and an optical disc drive (ODD) as a storage device.

According to the aforementioned example embodiments, a gap between some transistors from among the transistors providing a sampling circuit, which are greatly affected by a capacitance caused by a coupling effect, may be be greater than a gap between the other transistors. Accordingly, an effect caused by the capacitance may be reduced such that an image sensor having improved operational performance including noise properties may be provided.

While the example embodiments have been shown and described above, it will be apparent to those skilled in the art that modifications and variations could be made without departing from the scope as defined by the appended claims.

What is claimed is:

1. An image sensor, comprising:
a pixel array including a plurality of pixels connected to row lines extending in a first direction and column lines extending in a second direction intersecting the first direction;
a ramp voltage generator configured to output a ramp voltage;
a sampling circuit including a plurality of comparators, each comparator of the plurality of comparators having a first input terminal connected to a column of the column lines and a second input terminal configured to receive the ramp voltage; and
an analog-to-digital converter configured to convert an output of the plurality of comparators to a digital signal,
wherein the plurality of comparators include a first comparator connected to a first column line, and a second comparator connected to a second column line adjacent to the first column line in the first direction,
wherein a first transistor of the first comparator is disposed consecutively with a second transistor of the first comparator in the second direction,
wherein a first transistor of the second comparator is disposed consecutively with a second transistor of the second comparator in the second direction, and
wherein a gap between the first transistor of the first comparator and the second transistor of the first comparator is different from a gap between the first transistor of the second comparator and the second transistor of the second comparator.

2. The image sensor of claim 1, wherein the first comparator includes a metal-oxide semiconductor (MOS) capacitor of the first comparator, and the second comparator includes a MOS capacitor of the second comparator, and
wherein a position of the MOS capacitor of the first comparator is different from a position of the MOS capacitor of the second comparator in the first direction and in the second direction.

3. The image sensor of claim 1, wherein the first comparator includes an output transistor of the first comparator connected between a first power node configured to supply a power voltage and an output terminal of the first comparator,
wherein the second comparator includes an output transistor of the second comparator connected between the first power node and an output terminal of the second comparator, and
wherein a position of the output transistor of the first comparator is different from a position of the output transistor of the second comparator in the first direction and the second direction.

4. The image sensor of claim 1, wherein each of the first comparator and the second comparator includes a plurality of transistors configured to provide an amplifier circuit, and
wherein at least one transistor of the plurality of transistors included in the first comparator and at least one corresponding transistor of the plurality of transistors included in the second comparator are disposed in a same position in the second direction.

5. The image sensor of claim 4, wherein the plurality of transistors includes a first p-type metal-oxide semiconductor (PMOS) transistor, a second PMOS transistor, a first n-type metal-oxide semiconductor (NMOS) transistor connected to one of the column lines, and a second NMOS transistor configured to receive the ramp voltage.

6. The image sensor of claim 5, wherein a size of the first PMOS transistor is equal to a size of the second PMOS transistor.

7. The image sensor of claim 5, wherein a size of the first NMOS transistor is equal to a size of the second NMOS transistor.

8. The image sensor of claim 1, further comprising:
a shield region disposed between circuit elements of the first comparator and circuit elements of the second comparator, and extending in the second direction.

9. The image sensor of claim 1, wherein a size of a region including circuit elements of the first comparator is equal to a size of a region including circuit elements of the second comparator.

10. The image sensor of claim 1, wherein each of the first comparator and the second comparator includes a third transistor adjacent to the second transistor in the second direction.

11. The image sensor of claim 10, wherein a gap between the second transistor of the first comparator and the third transistor of the first comparator is different from a gap between the second transistor of the second comparator and the third transistor of the second comparator, in the second direction.

12. The image sensor of claim 10, wherein a gap between the second transistor of the first comparator and the third transistor of the first comparator is equal to a gap between the first transistor of the second comparator and the second transistor of the second comparator, in the second direction.

13. The image sensor of claim 10, wherein a gap between the first transistor of the first comparator and the third transistor of the first comparator is equal to a gap between the first transistor of the second comparator and the third transistor of the second comparator, in the second direction.

14. The image sensor of claim 10, wherein a gap between the first transistor of the first comparator and the third transistor of the first comparator is different from a gap between the first transistor of the second comparator and the third transistor of the second comparator, in the second direction.

15. The image sensor of claim 10, wherein a gap between the first transistor of the first comparator and the second transistor of the second comparator is less than a length of the second transistor of the first comparator, in the second direction.

16. The image sensor of claim 1, wherein the first transistor of the first comparator is arranged adjacent to the second transistor of the first comparator in the second direction, and
wherein the first transistor of the second comparator is arranged adjacent to the second transistor of the second comparator in the second direction.

17. An image sensor, comprising:
a pixel array including a plurality of pixels connected to row lines extending in a first direction and column lines extending in a second direction intersecting the first direction; and
a sampling circuit including a plurality of comparators and connected to the column lines, wherein the plurality of comparators include circuit elements disposed on a substrate and a plurality of metal-oxide semiconductor (MOS) capacitors configured to determine a bandwidth of an output signal, wherein the plurality of comparators includes odd comparators connected to odd-numbered column lines and even comparators connected to even-numbered column lines, wherein the plurality of MOS capacitors includes odd MOS capacitors corresponding to the odd comparators and even MOS capacitors corresponding to the even comparators, wherein the odd MOS capacitors are disposed in a first position in the second direction, and the even MOS capacitors are disposed in a second position in the second direction, wherein the second position is different from the first position, and wherein the odd numbered column lines are empty at the second position in the second direction, and the even-numbered column lines are empty at the first position in the second direction.

18. The image sensor of claim 17, wherein the circuit elements are not disposed in the second position in the odd comparators, and the circuit elements are not disposed in the first position in the even comparators.

19. The image sensor of claim 17, wherein transistors different from the odd MOS capacitors are disposed in the second position in the odd comparators, and transistors different from the even MOS capacitors are disposed in the first position in the even comparators.

20. The image sensor of claim 19, wherein the transistors different from the odd MOS capacitors have a same type as the transistors different from the even MOS capacitors.

21. The image sensor of claim 17, wherein the plurality of comparators includes a plurality of output transistors configured to output the output signal, and wherein gates of the plurality of output transistors are connected to gates of the plurality of MOS capacitors.

22. The image sensor of claim 21, wherein the plurality of output transistors includes odd output transistors corresponding to the odd comparators, and even output transistors corresponding to the even comparators, and wherein positions of the odd output transistors different from positions of the even output transistors.

23. The image sensor of claim 21, wherein the plurality of output transistors includes odd output transistors corresponding to the odd comparators, and even output transistors corresponding to the even comparators, and wherein the odd output transistors are disposed in a position different from the second position in the second direction.

24. The image sensor of claim 21, wherein each of the plurality of output transistors is smaller than each of the plurality of MOS capacitors.

25. An image sensor, comprising:

a pixel array including a plurality of pixels connected to a plurality of row lines extending in a first direction and a plurality of column lines; and a plurality of comparators connected to the column lines, and disposed in a plurality of unit regions arranged in the first direction, wherein the plurality of comparators includes a first comparator adjacent to a second comparator, wherein a first transistor of the first comparator is arranged consecutively with a second transistor of the first comparator, wherein a first transistor of the second comparator is disposed consecutively with a second transistor of the second comparator, and wherein a gap between the first transistor of the first comparator and the second transistor of the first comparator is smaller than a gap between the first transistor of the second comparator and the second transistor of the second comparator.

26. The image sensor of claim 25, wherein, the first transistors are linearly arranged in the first direction, and the second transistors are arranged in an alternating pattern in the first direction.

* * * * *